(12) United States Patent
Yamazaki et al.

(10) Patent No.: US 9,929,350 B2
(45) Date of Patent: Mar. 27, 2018

(54) LIGHT-EMITTING DEVICE

(75) Inventors: Shunpei Yamazaki, Tokyo (JP);
Satoshi Seo, Kanagawa (JP);
Nobuharu Ohsawa, Kanagawa (JP);
Satoko Shitagaki, Kanagawa (JP);
Hideko Inoue, Kanagawa (JP); Hiroshi Kadoma, Kanagawa (JP); Harue Osaka, Kanagawa (JP); Kunihiko Suzuki, Kanagawa (JP); Yasuhiko Takemura, Kanagawa (JP)

(73) Assignee: Semiconducor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/405,627

(22) Filed: Feb. 27, 2012

(65) Prior Publication Data
US 2012/0217487 A1  Aug. 30, 2012

(30) Foreign Application Priority Data

Feb. 28, 2011 (JP) ................................ 2011-042120
Feb. 28, 2011 (JP) ................................ 2011-042122

(51) Int. Cl.
*H01L 29/08* (2006.01)
*H01L 35/24* (2006.01)
*H01L 51/00* (2006.01)

(52) U.S. Cl.
CPC ...... *H01L 51/0059* (2013.01); *H01L 51/0067* (2013.01); *H01L 2251/5384* (2013.01); *H01L 2251/552* (2013.01)

(58) Field of Classification Search
CPC ..................................................... H01L 21/00

USPC ............................................ 257/E51.026, 40
See application file for complete search history.

(56) References Cited

U.S. PATENT DOCUMENTS

| 6,803,720 | B2  | 10/2004 | Kwong et al. |
| 6,936,961 | B2* | 8/2005  | Liao et al. ............... 313/506 |
| 7,175,922 | B2  | 2/2007  | Jarikov et al. |
| 7,183,010 | B2  | 2/2007  | Jarikov |
| 7,273,663 | B2* | 9/2007  | Liao et al. ............... 428/690 |

(Continued)

FOREIGN PATENT DOCUMENTS

| CN | 101006594 A | 7/2007 |
| CN | 101471423 A | 7/2009 |

(Continued)

OTHER PUBLICATIONS

Non-Final Rejection of U.S. Appl. No. 13/370,679, filed Feb. 27, 2013.*

(Continued)

*Primary Examiner* — Telly Green
(74) *Attorney, Agent, or Firm* — Husch Blackwell LLP

(57) ABSTRACT

A light-emitting element includes a light-emitting layer including a guest, an n-type host and a p-type host between a pair of electrodes, where the difference between the energy difference between a triplet excited state and a ground state of the n-type host (or p-type host) and the energy difference between a triplet excited state and a ground state of the guest is 0.15 eV or more. Alternatively, in such a light-emitting element, the LUMO level of the n-type host is higher than the LUMO level of the guest by 0.1 eV or more, or the HOMO level of the p-type host is lower than the HOMO level of the guest by 0.1 eV or more.

25 Claims, 11 Drawing Sheets

(56) References Cited

U.S. PATENT DOCUMENTS

| | | | |
|---|---|---|---|
| 7,332,857 | B2 | 2/2008 | Seo et al. |
| 7,572,522 | B2 | 8/2009 | Seo et al. |
| 7,597,967 | B2 | 10/2009 | Kondakova et al. |
| 7,943,925 | B2 | 5/2011 | Yamazaki |
| 7,993,760 | B2 | 8/2011 | Kornorim et al. |
| 8,034,465 | B2 | 10/2011 | Liao et al. |
| 8,080,811 | B2 | 12/2011 | Yokoyama et al. |
| 8,274,214 | B2 | 9/2012 | Ikeda et al. |
| 8,435,811 | B2 | 5/2013 | Yokoyama et al. |
| 8,853,680 | B2 | 10/2014 | Yamazaki et al. |
| 8,963,127 | B2 | 2/2015 | Pieh et al. |
| 8,981,355 | B2 | 3/2015 | Seo |
| 8,994,263 | B2 | 3/2015 | Shitagaki et al. |
| 9,054,317 | B2 | 3/2015 | Endo et al. |
| 9,159,942 | B2 | 10/2015 | Seo et al. |
| 9,175,213 | B2 | 11/2015 | Seo et al. |
| 9,356,250 | B2 | 5/2016 | Ohsawa et al. |
| 9,604,928 | B2 | 3/2017 | Shitagaki et al. |
| 2003/0015960 | A1 | 1/2003 | Seo et al. |
| 2003/0175553 | A1 | 9/2003 | Thompson et al. |
| 2004/0183082 | A1 | 9/2004 | Yamazaki |
| 2004/0227460 | A1* | 11/2004 | Liao et al. .......... 313/506 |
| 2005/0048310 | A1* | 3/2005 | Cocchi et al. .......... 428/690 |
| 2005/0196775 | A1* | 9/2005 | Swager et al. .......... 435/6 |
| 2005/0221116 | A1 | 10/2005 | Cocchi et al. |
| 2006/0040132 | A1* | 2/2006 | Liao et al. .......... 428/690 |
| 2006/0087225 | A1* | 4/2006 | Liao et al. .......... 313/504 |
| 2006/0099447 | A1* | 5/2006 | Lee et al. .......... 428/690 |
| 2006/0134464 | A1 | 6/2006 | Nariyuki |
| 2006/0194076 | A1 | 8/2006 | Nariyuki |
| 2006/0228577 | A1* | 10/2006 | Nagara .......... 428/690 |
| 2007/0090756 | A1 | 4/2007 | Okada et al. |
| 2007/0145885 | A1 | 6/2007 | Tadokoro et al. |
| 2007/0222374 | A1* | 9/2007 | Egawa et al. .......... 313/504 |
| 2008/0054799 | A1* | 3/2008 | Satou .......... 313/504 |
| 2008/0149923 | A1 | 6/2008 | Ohsawa et al. |
| 2008/0160345 | A1* | 7/2008 | Inoue et al. .......... 428/691 |
| 2008/0286604 | A1* | 11/2008 | Inoue et al. .......... 428/690 |
| 2009/0136877 | A1* | 5/2009 | Suganuma .......... 430/325 |
| 2009/0166563 | A1* | 7/2009 | Yokoyama et al. .......... 250/492.1 |
| 2010/0052527 | A1* | 3/2010 | Ikeda et al. .......... 313/504 |
| 2010/0059741 | A1 | 3/2010 | Ohsawa et al. |
| 2011/0001146 | A1 | 1/2011 | Yamazaki et al. |
| 2011/0057178 | A1* | 3/2011 | Shitagaki et al. .......... 257/40 |
| 2011/0101319 | A1* | 5/2011 | Fukumatsu et al. .......... 257/40 |
| 2012/0205632 | A1* | 8/2012 | Shitagaki et al. .......... 257/40 |
| 2012/0205687 | A1 | 8/2012 | Yamazaki et al. |
| 2012/0206035 | A1 | 8/2012 | Shitagaki et al. |
| 2012/0217486 | A1 | 8/2012 | Takemura et al. |
| 2015/0069352 | A1 | 3/2015 | Kim et al. |

FOREIGN PATENT DOCUMENTS

| | | |
|---|---|---|
| CN | 102217419 A | 10/2011 |
| CN | 103081155 A | 5/2013 |
| EP | 1 202 608 A2 | 5/2002 |
| JP | 07-085972 A | 3/1995 |
| JP | 2006-203172 A | 8/2006 |
| JP | 2006-270053 A | 10/2006 |
| JP | 2007-042875 A | 2/2007 |
| JP | 2008-160098 A | 7/2008 |
| JP | 2008-288344 A | 11/2008 |
| JP | 2010-086952 A | 4/2010 |
| JP | 2015-028941 A | 2/2015 |
| KR | 2011-0065507 A | 6/2011 |
| TW | 543337 B | 7/2003 |
| TW | 201028037 | 7/2010 |
| WO | WO 00/70655 A2 | 11/2000 |
| WO | WO 02/47457 A2 | 6/2002 |
| WO | WO 03/083959 A1 | 10/2003 |
| WO | WO 2006/023322 A1 | 3/2006 |
| WO | WO 2008/065975 A1 | 6/2008 |
| WO | WO 2010/026859 A1 | 3/2010 |
| WO | WO 2012/111579 A9 | 8/2012 |

OTHER PUBLICATIONS

Final Rejection of U.S. Appl. No. 13/370,679, filed Jul. 31, 2013.*

Non-Final Rejection for U.S. Appl. No. 13/419,892 mailed on Aug. 12, 2013.*

Final Rejectioon for U.S. Appl. No. 13/419,892 mailed on Mar. 5, 2014.*

Hino et al. "Red Phosphorescent Organic Light-Emitting Diodes Using Mixture System of Small-Molecule and Polymer Host", Japanese Journal of Applied Physics, vol. 44, No. 4B 2005, pp. 2790-2794.*

Final Rejection of U.S. Appl. No. 12/873,544, filed Jul. 1, 2014, pp. 1-13.*

Itano, K. et al, "Exciplex Formation at the Organic Solid-State Interface: Yellow Emission in Organic Light-Emitting Diodes Using Green-Fluorescent Tris(8-Quinolinolato) Aluminum and Hole-Transporting Molecular Materials with Low Ionization Potentials," Applied Physics Letters, vol. 72, No. 6, Feb. 9, 1998, pp. 636-638.

Baldo, M.A. et al, "Very High-Efficiency Green Organic Light-Emitting Devices Based on Electrophosphorescence," Applied Physics Letters, vol. 75, No. 1, Jul. 5, 1999, pp. 4-6.

Choong, V.-E. et al, "Organic Light-Emitting Diodes with a Bipolar Transport Layer," Applied Physics Letters, vol. 75, No. 2, Jul. 12, 1999, pp. 172-174.

Tokito, S. et al, "Confinement of Triplet Energy on Phosphorescent Molecules for Highly-Efficient Organic Blue-Light-Emitting Devices," Applied Physics Letters, vol. 83, No. 3, Jul. 21, 1999, pp. 569-571.

Seo, J.-H. et al., "Efficient Blue-Green Organic Light-Emitting Diodes Based on Heteroleptic tris-cyclometalated iridium(III) Complexes," Thin Solid Films, vol. 517, No. 5, Jan. 1, 2009, pp. 1807-1810.

McGraw-Hill Dictionary of Scientific And Technical Terms, 5$^{th}$ ed., 1994, p. 1281.

Chinese Office Action re Application No. CN 201210057926.5, dated Jan. 25, 2016.

Taiwanese Office Action re Application No. TW 101106285, dated Mar. 4, 2016.

Chinese Office Action re Application No. CN 201210057926.5, dated Jun. 3, 2015.

Taiwanese Office Action re Application No. TW 105131699, dated Jul. 20, 2017.

Yersin, H. et al., *Highly Efficient OLEDs with Phosphorescent Materials*, 2008, pp. 1-97,283-309, Wiley-VCH Verlag GmbH & Co.

Tokito, S. et al., "Improvement in Performance by Doping," Organic EL Display, Aug. 20, 2004, pp, 67-99, Ohmsha.

Jeon, W.S. et al., "Ideal Host and Guest System in Phosphorescent OLEDs," Organic Electronics, 2009, vol. 10, pp. 240-246, Elsevier.

Su, S-J et al., "RGB Phosphorescent Organic Light-Emitting Diodes by Using Host Materials with Heterocyclic Cores:Effect of Nitrogen Atom Orientations," Chemistry of Materials, 2011, vol. 23, No. 2, pp. 274-284.

Rausch, A.F. et al., "Matrix Effects on the Triplet State of the OLED Emitter Ir(4,6-dFppy)2(pic)(FIrpic): Investigations by High-Resolution Optical Spectroscopy," Inorganic Chemistry, 2009, vol. 48, No. 5, pp. 1928-1937.

Gong, X. et al., "Phosphorescence from Iridium Complexes Doped into Polymer Blends," Journal of Applied Physics, Feb. 1, 2004, vol. 95, No. 3, pp. 948-953.

Zhao, Q. et al., "Synthesis and Photophysical, Electrochemical, and Electrophosphorescent Properties of a Series of Indium(III) Complexes Based on Quinoline Derivatives and Different β-Diketonate Ligands," Organometallics, Jun. 14, 2006, vol. 25, No. 15, pp. 3631-3638.

Tsuboyama, a. et al., "Homoleptic Cyclometalated Iridium Complexes with Highly Efficient Red Phosphorescence and Application to Organic Light-Emitting Diode," Journal of the American Chemical Society, 2003, vol. 125, No. 42, pp. 12971-12979.

Kondakova, M.E. et al., "High-Efficiency, Low-Voltage Phosphorescent Organic Light-Emitting Diode Devices with Mixed Host," Journal of Applied Physics, Nov. 4, 2008, vol. 104, pp. 094501-1-094501-17.

(56) References Cited

OTHER PUBLICATIONS

Chen, F-C. et al., "Triplet Exciton Confinement in Phosphorescent Polymer Light-Emitting Diodes," Applied Physics Letters, Feb. 17, 2003, vol. 82, No. 7, pp. 1006-1008.

Lee, J.Y. et al., "Stabilizing the Efficiency of Phosphorescent Organic Light-Emitting Diodes," SPIE Newsroom, Apr. 21, 2008, pp. 1-3.

Endo, A. et al., "Efficient Up-Conversion of Triplet and Its Application for Organic Light Emitting Diodes," Applied Into a Singlet State Physics Letters, Feb. 24, 2011, vol. 98, No. 8, pp. 083302-1-083302-3.

Park, Y-S. et al., "Efficient Triplet Harvesting by Fluorescent Molecules Through Exciplexes for High Efficiency Organic Light-Emitting Diodes," Applied Physics Letters, Apr. 18, 2013, vol. 102, No. 15, pp. 153306-1-153306-5.

* cited by examiner

LIGHT-EMITTING DEVICE

BACKGROUND OF THE INVENTION

1. Field of the Invention

The present invention relates to light-emitting elements utilizing organic electroluminescence (EL) (hereinafter, also referred to as organic EL elements).

2. Description of the Related Art

Organic EL elements have been keenly studied and developed (see, Patent Document 1 and Non-Patent Documents 1 and 2). An organic EL element has a basic structure in which a layer including a light-emitting organic compound (hereinafter, also referred to as light-emitting layer) is sandwiched between a pair of electrodes and has features of small thickness and light weight, high speed response to input signals, direct current low voltage driving, and the like; therefore, has been attracting attentions as a next generation flat panel display element. In addition, a display using such a light-emitting element has a feature of high contrast and high image quality, and wide viewing angle. Further, since an organic EL element is a plane light source, it is considered that the light-emitting element is applied as a light source such as a backlight of a liquid crystal display and a lighting device.

The light-emission mechanism of organic EL elements is a carrier-injection system. Namely, by voltage application between electrodes with a light emitting layer interposed between the electrodes, electrons and holes injected from the electrodes are recombined to make the light-emitting substance excited, and light is emitted when the light-emitting substance returns from the excited state to the ground state. There are two types of the excited states: a singlet excited state and a triplet excited state. Further, the statistical generation ratio of the singlet excited state to the triplet excited state in a light-emitting element is considered to be 1:3. Note that, unless indicating it in particular, a singlet excited state (or a triplet excited state) means a singlet excited state (or a triplet excited state) with the lowest energy level among the singlet excited states (or the triplet excited states), in the description.

In general, the ground state of a light-emitting organic compound is a singlet state. Light emission from a singlet excited state is referred to as fluorescence where electron transition occurs between the same spin multiplicities. On the other hand, light emission from a triplet excited state is referred to as phosphorescence where electron transition occurs between different spin multiplicities. Here, in a compound emitting fluorescence (hereinafter referred to as fluorescent compound), in general, phosphorescence is not observed at room temperature; and only fluorescence is observed. Accordingly, the internal quantum efficiency (the ratio of generated photons to injected carriers) of a light-emitting element including the fluorescent compound is assumed to have a theoretical limit of 25% based on the ratio of the singlet excited state to the triplet excited state (=1:3).

On the other hand, when a compound emitting phosphorescence (hereinafter referred to as phosphorescent compound) is used, the internal quantum efficiency can be theoretically increased to 100%. In other words, higher emission efficiency can be obtained than that when a fluorescent compound is used. Therefore, the light-emitting element using a phosphorescent compound has been actively developed in recent years in order to achieve a highly efficient light-emitting element.

As the phosphorescent compound, an organometallic complex that has iridium or the like as a central metal has particularly alit acted attentions because of its high phosphorescence quantum yield; for example, an organometallic complex that has iridium as a central metal is disclosed as a phosphorescent material in Patent Document 1.

When a light-emitting layer of a light-emitting element is formed using a phosphorescent compound described above, in order to suppress concentration quenching or quenching due to triplet-triplet annihilation in the phosphorescent compound, the light-emitting layer is often formed such that the phosphorescent compound is dispersed in a matrix of another compound. Here, the compound serving as the matrix is called host, and the compound dispersed in the matrix, such as a phosphorescent compound, is called guest.

There are generally given several elementary processes of light emission in a light-emitting element using a phosphorescent compound as a guest like that, and descriptions of the elementary processes are given below.

(1) An electron and a hole are recombined in a guest molecule, and the guest molecule is excited (direct recombination process).

(1-1) When the excited state of the guest molecule is a triplet excited state, the guest molecule emits phosphorescence.

(1-2) When the excited state of the guest molecule is a singlet excited state, the guest molecule in the singlet excited state undergoes intersystem crossing to a triplet excited state, which emits phosphorescence.

In other words, in the direct recombination process in (1), as long as the efficiency of intersystem crossing and the phosphorescence quantum efficiency of the guest molecule are high, a high emission efficiency can be obtained.

(2) An electron and a hole are recombined in a host molecule, and the host molecule is put in an excited state (energy transfer process).

(2-1) When the excited state of the host molecule is a triplet excited state and the energy level in the triplet excited state (T1 level) of the host molecule is higher than that of the guest molecule, excitation energy is transferred from the host molecule to the guest molecule, and thus the guest molecule is put in a triplet excited state. The guest molecule in the triplet excited state emits phosphorescence. Note that energy transfer to an energy level in a singlet excitation state (S1 level) of the guest molecule is possible in theory; however, in many cases, the S1 level of the guest molecule is higher than the T1 level of the host molecule, and thus such energy transfer to a singlet excitation energy level (S1 level) of the guest molecule is difficult to be a main energy transfer process. Therefore, description thereof is not given here.

(2-2) When the excited state of the host molecule is a singlet excited state, in a case where an energy level in a singlet excitation state (S1 level) of the host molecule is higher than the S1 level and T1 level of the guest molecule, excitation energy is transferred from the host molecule to the guest molecule, and thus, the guest molecule is put in a singlet excited state or a triplet excited state. The guest molecule in the triplet excited state emits phosphorescence. In addition, the guest molecule in the singlet excited state makes intersystem crossing with a triplet excited state, which emits phosphorescence.

In other words, in the energy transfer process in (2), it is important how efficiently both the triplet excitation energy and the singlet excitation energy of the host molecule can move to the guest molecule.

In view of the energy transfer process, before excitation energy is transferred from the host molecule to the guest molecule, the host molecule itself radiates its excitation energy in the form of light or heat to be inactivated, which decreases emission efficiency.

[Energy Transfer Process]

Energy transfer processes between molecules are described below in details.

First, as a mechanism of energy transfer between molecules, the following two mechanisms are proposed. A molecule giving excitation energy is referred to as host molecule, while a molecule taking excitation energy is referred to as guest molecule.

[[Förster Mechanism (Dipole-Dipole Interaction)]]

Förster mechanism (also referred to as Förster resonance energy transfer) does not require direct contact between molecules for energy transfer. Through a resonant phenomenon of dipolar oscillation between a host molecule and a guest molecule, energy is transferred. By the resonant phenomenon of dipolar oscillation, the host molecule gives energy to the guest molecule, and thus the host molecule is put in a ground state and the guest molecule is put in an excited state. The rate constant $k_h^*{\rightarrow}g$ of Förster mechanism is expressed by a formula (1).

[Formula (1)]

$$k_{h^*\rightarrow g} = \frac{9000c^4 K^2 \phi \ln 10}{128\pi^5 n^4 N \tau R^6} \int \frac{f'_h(\nu)\varepsilon_g(\nu)}{\nu^4} d\nu \quad (1)$$

In the formula 1, $\nu$ denotes a frequency, $f'_h(\nu)$ denotes a normalized emission spectrum of a host molecule (a fluorescent spectrum in energy transfer from a singlet excited state, and a phosphorescent spectrum in energy transfer from a triplet excited state), $\varepsilon_g(\nu)$ denotes a molar absorption coefficient of a guest molecule, N denotes Avogadro's number, n denotes a refractive index of a medium, R denotes an intermolecular distance between the host molecule and the guest molecule, $\tau$ denotes a measured lifetime of an excited state (fluorescent lifetime or phosphorescent lifetime), c denotes light speed, $\varphi$ denotes a luminescence quantum efficiency (a fluorescent quantum efficiency in energy transfer from a singlet excited state, and a phosphorescent quantum efficiency in energy transfer from a triplet excited state), and $K^2$ denotes a coefficient (0 to 4) of orientation of a transition dipole moment between the host molecule and the guest molecule. Note that $K^2=2/3$ in random orientation.

[[Dexter Mechanism (Electron Exchange Interaction)]]

In Dexter mechanism (also referred to as Dexter electron transfer), a host molecule and a guest molecule are close to a contact effective range where their orbitals overlap, and the host molecule in an excited state and the guest molecule in a ground state exchange their electrons, which leads to energy transfer. The rate constant $k_h^*{\rightarrow}g$ of Dexter mechanism is expressed by a formula (2).

[Formula (2)]

$$k_{h^*\rightarrow g} = \left(\frac{2\pi}{h}\right) K^2 \exp\left(-\frac{2R}{L}\right) \int f'_h(\nu)\varepsilon'_g(\nu) d\nu \quad (2)$$

In the formula (2), h denotes a Planck constant, K denotes a constant having an energy dimension, $\nu$ denotes a frequency, $f'_h(\nu)$ denotes a normalized emission spectrum of a host molecule (a fluorescent spectrum in energy transfer from a singlet excited state, and a phosphorescent spectrum in energy transfer from a triplet excited state), $\varepsilon'_g(\nu)$ denotes a normalized absorption spectrum of a guest molecule, L denotes an effective molecular radius, and R denotes an intermolecular distance between the host molecule and the guest molecule.

Here, the efficiency $\Phi_{ET}$ of energy transfer from the host molecule to the guest molecule is thought to be expressed by a formula (3). In the formula, $k_r$ denotes a rate constant of a light-emission process of the host molecule (fluorescence in energy transfer from a singlet excited state of the host molecule, and phosphorescence in energy transfer from a triplet excited state of the host molecule), $k_n$ denotes a rate constant of a non-light-emission process (thermal deactivation or intersystem crossing), and $\tau$ denotes a measured lifetime of the excited state of the host molecule.

[Formula (3)]

$$\Phi_{ET} = \frac{k_{h^*\rightarrow g}}{k_r + k_n + k_{h^*\rightarrow g}} = \frac{k_{h^*\rightarrow g}}{\left(\frac{1}{\tau}\right) + k_{h^*\rightarrow g}} \quad (3)$$

First, according to the formula (3), in order to increase the efficiency $\Phi_{ET}$ of energy transfer, the rate constant $k_h^*{\rightarrow}g$ of energy transfer should be further increased as compared with another competing rate constant kr+kn (=1/$\tau$). Then, in order to increase the rate constant $k_h^*{\rightarrow}g$ of energy transfer, based on the formulae (1) and (2), in Förster mechanism and Dexter mechanism, the overlapping portion of a light-emission spectrum of a host molecule (a fluorescent spectrum in energy transfer from a singlet excited state, and a phosphorescent spectrum in energy transfer from a triplet excited state) and an absorption spectrum of a guest molecule (an energy difference between a triplet excited state and a ground state in the usual case of phosphorescence) is preferably large.

For example, by materials selected such that an energy difference between the triplet excited state and the ground state of the host molecule overlaps with an energy difference between the triplet excited state and the ground state of the guest molecule, energy is efficiently transferred from the host to the guest.

However, such energy transfer occurs similarly in transfer from a guest molecule in a triplet excited state to a host molecule in a ground state. By materials selected such that an energy difference between the triplet excited state and the ground state of the host molecule is equal or close to an energy difference between the triplet excited state and the ground state of the guest molecule, energy is easily transferred from the guest molecule in the triplet excited state to the host molecule in the triplet excited state. As a result, emission efficiency is decreased unfortunately.

Against such a problem, for example, as described in Non-Patent Document 1, there is proposed a method in which the energy difference between the triplet excited state and the ground state of a host molecule is made larger than the energy difference between the triplet excited state and the ground state of a guest molecule.

In Non-Patent Document 1, the energy difference between the triplet excited state and the ground state of a host molecule is larger than the energy difference between the triplet excited state and the ground state of a guest molecule by 0.3 eV (at present, it is converted into 0.15 eV), and thereby transition does not occur from the triplet excited state of the guest molecule to the triplet excited state of the host molecule.

In other words, the energy difference between the triplet excited state and the ground state of a host molecule is larger than the energy difference between the triplet excited state and the ground state of a guest molecule by 0.15 eV and thereby, transition from the triplet excited state of the guest molecule to the triplet excited state of the host molecule can be inhibited well.

REFERENCE

Patent Document

[Patent Document 1] PCT International Publication No. 2000/070655

Non-Patent Document

[Non-Patent Document 1] Shizuo Tokito et al., "Confinement of triplet energy on phosphorescent molecules for highly-efficient organic blue-light-emitting devices", Appl. Phys. Lett., 83, 569 (2003).

[Non-Patent Document 2] Vi-En Choong et al., "Organic light-emitting diodes with a bipolar transport layer", Appl. Phys. Lett., 75, 172 (1999).

However, the energy difference of a host molecule is different from that of a guest molecule as described above, which means that Forster mechanism or Dexter mechanism hardly occurs, and thus decrease in emission efficiency resulting from that is a problem. One embodiment of the present invention provides a light-emitting element that is free from such a discrepancy and is based on a novel principle.

As described above, various excitation processes are given, but the direct recombination process causes little deactivation and thus the rate of the direct recombination process is preferably increased for improvement of emission efficiency or external quantum efficiency. It is an object of one embodiment of the present invention to provide a method of causing the direct recombination process efficiently. Further, it is an object of another embodiment of the present invention to provide a light-emitting element with high external quantum efficiency.

SUMMARY OF THE INVENTION

One embodiment of the present invention is a light-emitting element including a phosphorescent compound (guest), a first organic compound, and a second organic compound between a pair of electrodes, wherein an energy difference between a triplet excited state and a ground state of each of the first organic compound and the second organic compound is larger than an energy difference between a triplet excited state and a ground state of the guest by 0.15 eV.

In the above-described embodiment, a combination of the first organic compound and the second organic compound than can make an exciplex together may be employed. In addition, the first organic compound may have a superior electron-transport property to a hole-transport property, and the second organic compound may have a superior hole-transport property to an electron-transport property. When they have such features, the first organic compound and the second organic compound are referred to as n-type host and p-type host, respectively.

In addition, another embodiment of the present invention is a light-emitting element that includes a light-emitting layer including a guest, an n-type host, and a p-type host between a pair of electrodes, wherein the LUMO (Lowest Unoccupied Molecular Orbital) level of the n-type host is higher than the LUMO level of the guest by 0.1 eV or more.

Note that it is not preferable in view of electric conduction that the LUMO level of the guest is too much lower than the LUMO level of the n-type host. Therefore, preferably, an value (En−Ea) obtained by subtracting the LUMO level Ea of the guest from the LUMO level En of the n-type host is from 0.1 eV to 0.5 eV.

Further, another embodiment of the present invention is a light-emitting element that includes a light-emitting layer including a guest, an n-type host, and a p-type host between a pair of electrodes, wherein the HOMO (Highest Occupied Molecular Orbital) level of the p-type host is lower than the HOMO level of the guest by 0.1 eV or more.

Note that it is not preferable in view of electric conduction that the HOMO level of the guest is too much higher than the HOMO level of the p-type host. Therefore, preferably, an value (Ep−Eb) obtained by subtracting the HOMO level Eb of the guest from the HOMO level Ep of the p-type host is from −0.5 eV to −0.1 eV.

In the above light-emitting element, the guest is preferably an organometallic complex. In the above light-emitting element, at least one of the n-type host and the p-type host may be a fluorescent compound. The light-emitting element according to one embodiment of the present invention can be applied to light-emitting devices, electronic devices, and lighting devices.

In one embodiment of the present invention, the light-emitting layer includes the n-type host molecule, the p-type host molecule, and the guest molecule. Needless to say, the molecules are not necessarily arranged regularly and may be arranged in an almost ruleless manner. In particular, when the light-emitting layer is formed as a thin film with a thickness of 50 nm or less, it is preferably amorphous, and thus a combination of materials that are hardly crystallized is preferable.

In addition, as illustrated in FIG. 1A, one embodiment of the present invention may be a light-emitting element in which a first electrode 103, a light-emitting layer 102 having the above-described structure, and a second electrode 104 are stacked over a substrate 101. Here, the first electrode 103 serves as one of an anode and a cathode, while the second electrode 104 serves as the other one of the anode and the cathode.

Further, as illustrated in FIG. 1B, one embodiment of the present invention may be a light-emitting element in which a first carrier-injection layer 105, a first carrier-transport layer 106, a second carrier-injection layer 107, a second carrier-transport layer 108 are stacked in addition to the first electrode 103, the light-emitting layer 102, and the second electrode 104. Here, the first carrier means one of an electron and a hole, while the second carrier means the other of the electron and the hole. In addition, when the first electrode serves as an anode, the first carrier is a hole, whereas when the first electrode serves as a cathode, the first carrier is an electron.

In one embodiment of the present invention, the energy difference between a triplet excited state and a ground state of each of host molecules (n-type host and p-type host) is larger than the energy difference between a triplet excited state and a ground state of a guest molecule by 0.15 eV or more, and thereby transition from the triplet excited state of the guest molecule to the triplet excited state of the host molecules (n-type host and p-type host) can be inhibited well; therefore, a light-emitting element with external quantum efficiency can be provided.

On the other hand, as for energy transfer process due to Förster mechanism or Dexter mechanism, energy can be transferred from an exciplex generated by the n-type host molecule and the p-type host to the guest molecule. When the energy of the exciplex is transferred to the guest molecule, the exciplex is divided into the n-type host molecule and the p-type host molecule, and the energy difference between the triplet excited state and the ground state of the n-type host molecule (or p-type host molecule) is higher than the energy difference between the triplet excited state and the ground state of the guest molecule by 0.15 eV or more, and thus energy is not transferred from the triplet excited state of the guest molecule to the triplet excited state of the n-type host molecule (or p-type host molecule).

In addition, in one embodiment of the present invention, for example, the LUMO level of the n-type host molecule is higher than the LUMO level of the guest molecule by 0.1 eV or more, and thus electrons passing through the n-type host molecule are preferentially transferred to the LUMO level of the guest molecule. As a result, the guest molecule serves as an anion to draw a hole, and in the guest molecule, the hole and the electron are recombined.

In addition, in one embodiment of the present invention, for example, the HOMO level of the p-type host molecule is lower than the HOMO level of the guest molecule by 0.1 eV or more, and thus holes passing through the p-type host molecule are preferentially transferred to the HOMO level of the guest molecule. As a result, the guest molecule serves as a cation to draw an electron, and in the guest molecule, the hole and the electron are recombined.

As described above, in accordance with one embodiment of the present invention, carriers are efficiently injected to a guest molecule, and thus the rate of direct recombination process can be increased. In particular, in one embodiment of the present invention, an n-type host and a p-type host are mixed in a light-emitting layer, and an electron tends to pass through the n-type host molecule and a hole tends to pass through the p-type host molecule. Accordingly, an electron is injected to the LUMO level of a guest molecule from the n-type host molecule and a hole is injected into the HOMO level of the guest molecule from the p-type host molecule.

DETAILED DESCRIPTION OF THE INVENTION

Figure 1A:
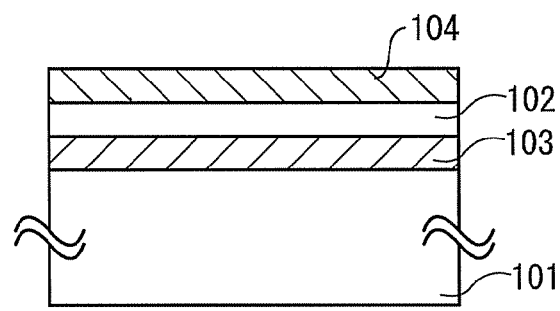
FIGS. 1A to 1D illustrate a variety of embodiments of the present invention.

Embodiments will now be described with reference to drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Embodiment 1

Figure 2A:
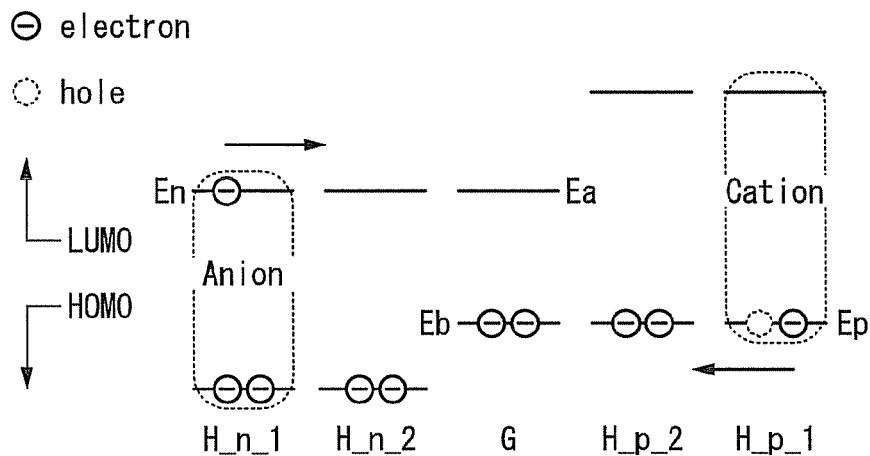
FIGS. 2A to 2C illustrate a principle of one embodiment of the present invention.

In this embodiment, a principle of a light-emitting element of one embodiment of the present invention will be described with reference to FIGS. 2A to 2C. FIG. 2A illustrates energy states of molecules when two n-type host molecules (H_n_1, H_n_2), one guest molecule (G), and two p-type host molecules (H_p_1, H_p_2) are linearly arranged. Each molecule has a HOMO level and a LUMO level.

Here, for simple description, the LUMO level En of the n-type host molecule is equal to the LUMO level Ea of the guest molecule and the HOMO level Ep of the p-type host molecule is equal to the HOMO level Eb of the guest molecule, but without being limited to this example, $-0.3$ eV$<$Ea$-$En$<+0.3$ eV, and $-0.3$ eV$<$Eb$-$Ep$<+0.3$ eV may be satisfied. In addition, the difference between the LUMO level and the HOMO level of the n-type host molecule (or p-type host molecule) is preferably larger than the difference between the LUMO level and the HOMO level of the guest molecule by 0.5 eV or more.

In each of the n-type host molecules, the p-type host molecules, and the guest molecule, two electrons exist at HOMO and no electrons exist at LUMO in the ground state. For example, the n-type host molecule H_n_2, the guest molecule and the p-type host molecule H_p_2 have two electrons at HOMO, while they have no electrons at LUMO.

On the other hand, when a hole is injected from an anode (on the right hand in FIG. 2A), and an electron is injected from a cathode (on the left hand in FIG. 2A), the n-type host molecule H_n_1 has an electron at LUMO, and the p-type host molecule H_p_1 has only one electron at HOMO (i.e., has one hole). In other words, the n-type host molecule H_n_1 serves as an anion and the p-type host molecule H_p_1 serves as a cation.

The electron and the hole pass through the n-type host molecule and the p-type host molecule by hopping in this manner. As illustrated in FIG. 2B, an electron is injected into the LUMO of the guest molecule, and a hole is injected into the HOMO thereof (direct recombination process), and thus the guest molecule is put in an excited state (intramolecular excimer, exciton). In this manner, even in the direct recombination process, in particular, a phenomenon that carriers are directly injected to the guest from the n-type host and p-type host is referred to as guest coupled with complementary hosts (GCCH).

Figure 2B:
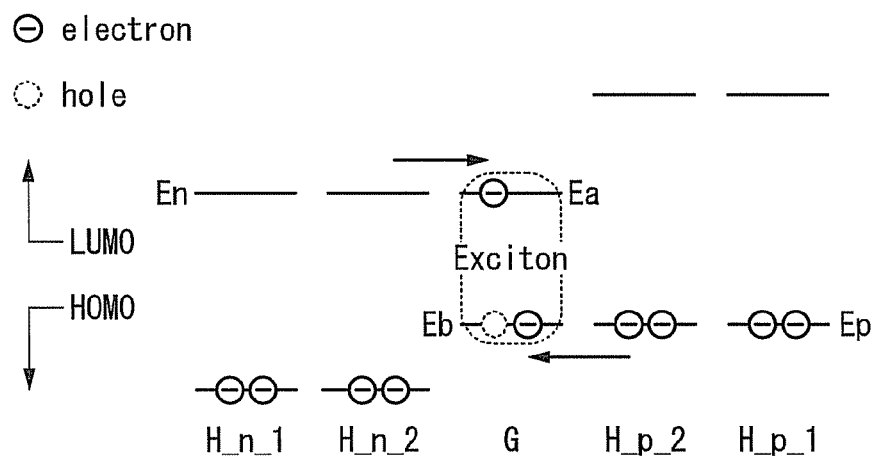

Incidentally, as apparent from FIGS. 2A and 2B, the difference between the LUMO level and the HOMO level of the n-type host molecule and the difference between the LUMO level and the HOMO level of the p-type host molecule are both much larger than the difference between the LUMO level and the HOMO level of the guest molecule. For that reason, due to Förster mechanism or Dexter mechanism, the probability of the transition of the triplet excited state of the guest to the triplet excited state of the n-type host or the p-type host is sufficiently low.

Figure 2C:
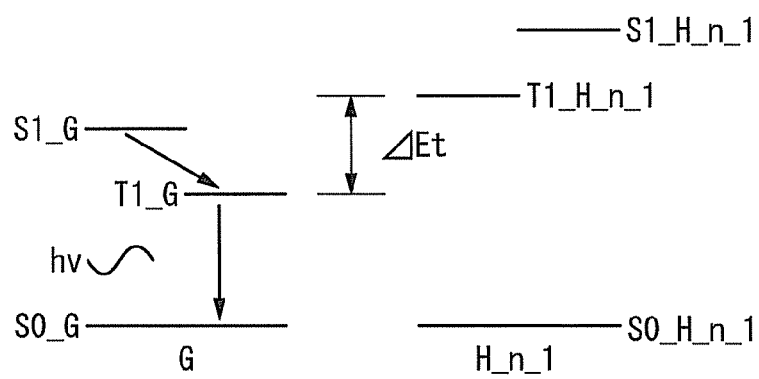

In other words, as illustrated in FIG. 2C, when the ground states of the guest molecule G and the n-type host molecule H_n_1 (S0_G and S0_H_n_1 respectively) are regarded as the basis, the energy level T1_H_n_1 in the triplet excited state of the n-type host molecule H_n_1 is higher than the energy level T1_G in triplet excited state of the guest molecule G by ΔEt (≥0.15 eV), and thus transition therebetween hardly occurs at room temperatures. Note that in FIG. 2C, S1_G and S1_H_n_1 mean energy levels in the singlet excited states of the guest molecule G and the n-type host molecule H_n_1 respectively.

With reference to FIG. 2C, the energy state of the n-type host molecule has been described, however, a similar effect can be obtained even with the p-type host molecule, as long as the energy level in the triplet excited state of the p-type host molecule is higher than the energy level in the triplet excited state of the guest Molecule.

To be exact, the difference between the LUMO level and the HOMO level of a molecule is not necessarily the energy difference between the triplet excited state and the ground state of the molecule, but it can be said that there is a certain relation between the former and the latter. For example, (acetylacetonato)bis(4,6-diphenylpyrimidinato)iridium(III) (abbreviation Ir(dppm)$_2$(acac)), described below, is used as a guest, and the difference between the HOMO level and the LUMO level of Ir(dppm)$_2$(acac) is 2.58 eV, while the energy difference between the triplet excited state and the ground state of Ir(dppm)$_2$(acac) is 2.22 eV. In addition, 2-[3-(dibenzothiophen-4-yl)phenyl]dibenzo[f,h]quinoxaline (abbreviation: 2mDBTPDBq-II) that is used as an n-type host has 3.10 eV as the difference between the HOMO level and the LUMO level and 2.54 eV as the energy difference between the triplet excited state and the ground state; and 4,4'-di(1-naphthyl)-4"-(9-phenyl-9H-carbazol-3-yl)triphenylamine (abbreviation: PCBNBB) that is used as a p-type host has 3.15 eV as the difference between the HOMO level and the LUMO level and 2.40 eV as the energy difference between the triplet excited state and the ground state.

In addition, when Ir(dppm)$_2$(acac), 2mDBTPDBq-II, and PCBNBB, which are described above, are used as a guest, an n-type host, and a p-type host, respectively, the energy differences between the triplet excited states and the ground states of 2mDBTPDBq-II and PCBNBB (2.54 eV and 2.40 eV, respectively, as the results of optical measurement) are higher than the energy difference between the triplet excited state and the ground state of the guest (2.22 eV as the result of optical measurement) by 0.18 eV or more, and thus the triplet excited state of the guest is hardly transmitted to the host.

Further, (dipivaloylmethanato)bis(3,5-dimethyl-2-phenylpyrazinato)iridium(III) (abbreviation: [Ir(mppr-Me)$_2$(dpm)]) can be used as a guest. The energy difference between the triplet excited state and the ground state of Ir(mppr-Me)$_2$(dpm) is 2.24 eV as the result of optical measurement.

Therefore, when 2mDBTPDBq-II is used as an n-type host and PCBNBB is used as a p-type host, the energy differences between the triplet excited states and the ground states of 2mDBTPDBq-II and PCBNBB are higher than the energy difference between the triplet excited state and the ground state of Ir(mppr-Me)$_2$(dpm) by 0.16 eV more, and thus, the triplet excited state of the guest is hardly transmitted to the host.

The direct recombination process where an electron and a hole are injected into a guest has been described above, but the n-type host molecule and the p-type host molecule make an exciplex, and it conducts energy transfer to the guest molecule, and thereby the guest molecule can be put in an excited state. In this case, energy transfer is conducted due to Förster mechanism or Dexter mechanism.

The exciplex is formed by an interaction between dissimilar molecules in excited states. The exciplex is generally known to be easily formed between a material having a relatively deep LUMO level and a material having a relatively shallow HOMO level. For example, a p-type host can be used as the former and an n-type host can be used as the latter.

Here, the HOMO level and the LUMO level of the n-type host are different from those of the p-type host, and the levels are higher like this: the HOMO level of the n-type host<the HOMO level of the p-type host<the LUMO level of the n-type host<the LUMO level of the p-type host.

When the exciplex is formed by the n-type host and the p-type host, the LUMO level and the HOMO level of the exciplex originate from the n-type host and the p-type host, respectively. Therefore, the energy difference of the exciplex is smaller than the energy difference of the n-type host and the energy difference of the p-type host. In other words, the emission wavelength of the exciplex is longer than the emission wavelengths of the n-type host and the p-type host. The formation process of the exciplex is considered to be roughly classified into the following two processes.

[Electroplex]

In this specification, the term "electroplex" means that the n-type host in the ground state and the p-type host in the ground state directly form an exciplex.

As described above, in Förster mechanism or Dexter mechanism, when an electron and a hole are recombined in a host, excitation energy is transferred from the host in an excited state to a guest, and thereby the guest is put in an excited state to emit light.

At this time, before the excitation energy is transferred from the host to the guest, the host itself emits light or the excitation energy turns into thermal energy, which leads to partial loss of the excitation energy. In particular, when the host is in a singlet excited state, excitation life is shorter than that when it is in a triplet excited state, which easily leads to deactivation of singlet exciton. The deactivation of exciton is one of causes for decrease in lifetime of a light-emitting element.

On the other hand, since, in one embodiment of the present invention, the n-type host and the p-type host exist in the same light-emitting layer, an electroplex is formed from the n-type host molecule and the p-type host molecule having carriers (anion and cation) in many cases. Thus, a singlet exciton of the n-type host molecule or a singlet exciton of the p-type host molecule that has a short lifetime is hardly formed.

In other words, without formation of a singlet exciton of each molecule, an exciplex is often directly formed. Thus, deactivation of the singlet exciton can be inhibited. Energy is transferred from the formed electroplex to the guest, and thereby a light-emitting element with high emission efficiency can be obtained.

[Formation of Exciplex by Exciton]

As another process, there is thought to be an elementary process where one of an n-type host molecule and a p-type host molecule serving as hosts forms a singlet exciton, and then the one interacts with the other host molecule in a ground state to form an exciplex. Differently from electroplex, a singlet excited exciton of the n-type host molecule or the p-type host molecule is formed in this case, but as long as this is transformed into an exciplex, needless to say, deactivation of single exciton can be inhibited. Note that as described below, when the n-type host and the p-type host exist in the same light-emitting layer, this process hardly occurs.

For example, the n-type host is a compound having an electron-trapping property, whereas the p-type host is a compound having a hole-trapping property. When the difference between the HOMO levels of the compounds and the difference between of the LUMO levels of the compounds are large (specifically, 0.3 eV or more), electrons are preferentially injected into the n-type host molecule and holes are preferentially injected into the p-type host molecule. In this case, it is thought that the formation process of an electroplex takes precedence over the formation process of an exciplex through a singlet exciton.

Energy transfer from the thusly formed exciplex to the guest molecule is due to Förster mechanism or Dexter mechanism. As described above, in such a mechanism, for example, the energy difference between the triplet excited state and the ground state in each of the host molecule and the guest molecule is preferably small.

In this case, the energy difference between the triplet excited state and the ground state of the exciplex corresponds to the difference between the LUMO level of the n-type host molecule and the HOMO level of the p-type host molecule, and when the differences are equal or close to the difference between the LUMO level and the HOMO level of the guest molecule, energy is efficiently transferred, so that the guest molecule is put in a triplet excited state and the exciplex itself is put in the ground state.

However, the exciplex is stable only in an excited state, and thus, when it returns to a ground state, the exciplex is divided into the n-type host molecule and the p-type host molecule. As described above, since the energy difference between the triplet excited state and the ground state of each of the n-type host molecule and the p-type host molecule is larger than the energy difference between the triplet excited state and the ground state of the guest molecule, energy transfer hardly ever occurs from the triplet excited state of the guest molecule to either the n-type host molecule or the p-type host molecule at room temperatures.

Embodiment 2

Figure 3A:
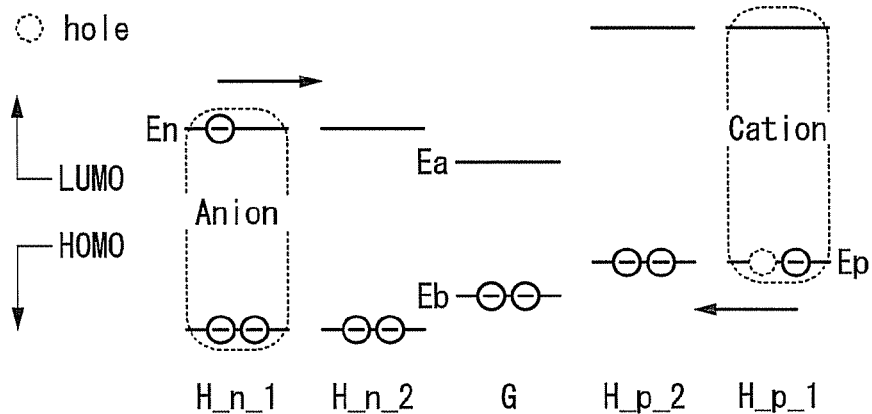
FIGS. 3A to 3C illustrate a principle of one embodiment of the present invention.
Figure 3B:
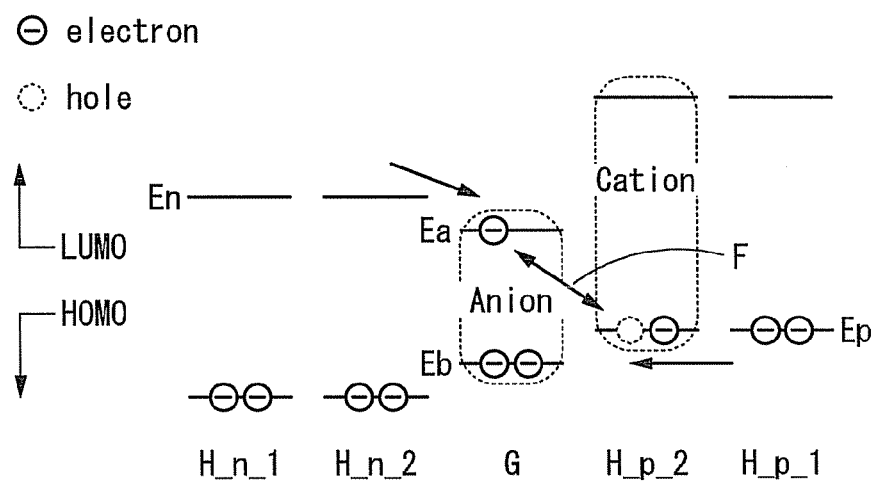
Figure 3C:
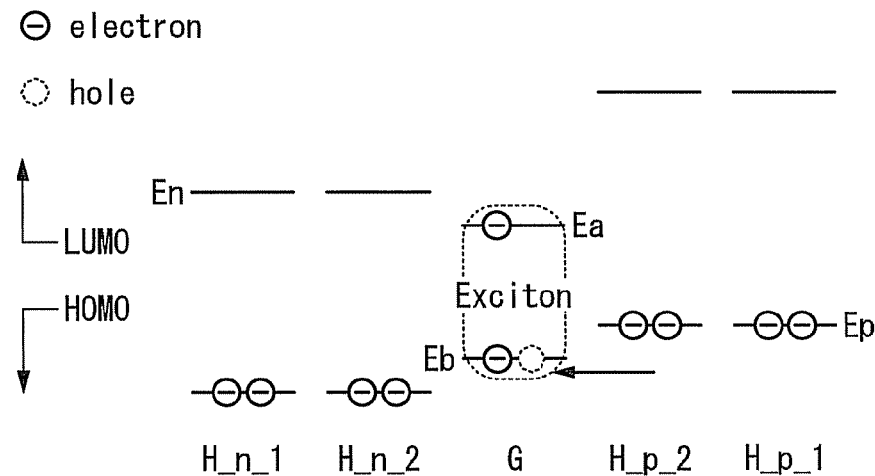

In this embodiment, a principle of a light-emitting element in accordance with one embodiment of the present invention with reference to FIGS. 3A to 3C. FIG. 3A illustrates energy state of molecules in a state where two n-type host molecules (H_n_1, H_n_2), one guest molecule (G), and two p-type host molecules (H_p_1, H_p_2) are aligned linearly. Each molecule has a HOMO level and a LUMO level.

Here, the LUMO level En of the n-type host molecule is higher than the LUMO level Ea of the guest molecule by 0.1 eV or more, and the HOMO level Ep of the p-type host molecule is higher than HOMO level Eb of the guest molecule. In addition, the difference between the LUMO level and the HOMO level of the n-type host molecule and the difference between the LUMO level and the HOMO level of the p-type host molecule are preferably both larger than the difference between the LUMO level and the HOMO level of the guest molecule by 0.5 eV or more.

As illustrated in FIG. 3A, a hole is injected from an anode (on the right hand in FIG. 3A), and an electron is injected from a cathode (on the left hand in FIG. 3A), the n-type host molecule H_n_1 has an electron at LUMO, and the p-type host molecule H_p_1 has only one electron at HOMO (i.e., has one hole). Thus, the n-type host molecule H_n_1 serves as an anion and the p-type host molecule H_p_1 serves as a cation.

The electron and the hole pass through the n-type host molecule and the p-type host molecule by hopping in this manner. As illustrated in the drawing, because the LUMO level of the p-type host molecule is higher than the LUMO level of the n-type host molecule, an electron is transferred in the n-type host molecules. In addition, because the HOMO level of the n-type host molecule is lower than the HOMO level of the p-type host molecule, a hole is transferred in the p-type host molecules.

As illustrated in FIG. 3B, an electron is injected to the LUMO level of the guest molecule, so that the guest molecule becomes an anion. Here, the LUMO level of the n-type host molecule is higher than the LUMO level of the guest molecule by 0.1 eV or more, and needless to say, the LUMO level of the p-type host molecule is much higher. Thus, the electron that has reached the LUMO level of the guest molecule becomes semi-stable; in other words, the electron is trapped by the guest molecule.

As a result, the guest molecule becomes a negatively-charged anion, and thus draws a hole around it due to coulomb interaction (denoted by F in the drawing). Therefore, as illustrated in FIG. 3C, the hole in the p-type host molecule H_p_2 is injected into the guest molecule G. Because the reach of coulomb interaction power is relatively large, an electron and a hole can be collected in the guest molecule efficiently.

Note that the electron in the LUMO level of the guest molecule G and the hole in the HOMO level of the p-type host molecule H_p_2 are recombined (in other words, the electron in the LUMO level of the guest molecule G moves to the HOMO level of the p-type host molecule H_p_2 or the hole in the HOMO level of the p-type host molecule H_p_2 moves to the LUMO level of the guest molecule G), so that light is generated at this time.

In addition, when such electron movement is forbidden, the hole in the HOMO level of the p-type host molecule H_p_2 moves to the HOMO level of the guest molecule G, so that the guest molecule G is put in an excited state. After that, the guest molecule G is put in a ground state, and in this process, light is generated.

In order that the guest draws a hole due to the coulomb interaction, $\Delta Ep < \Delta En + 0.2$ [eV], preferably $\Delta Ep < \Delta En$, may be satisfied, where $\Delta Ep$ denotes (HOMO level of the p-type host)−(HOMO level of the guest) and $\Delta En$ denotes (LUMO level of the n-type host)−(LUMO level of the guest). In this manner, a hole and an electron are recombined in the guest molecule.

The process results from that the guest molecule becomes an anion. If the charge of the guest molecule is neutral, the HOMO level of the guest molecule is lower than the HOMO level of the p-type host molecule, and thus the probability of injection of a hole to the guest molecule is low.

FIGS. 3A to 3C illustrate the case where the LUMO level En of the n-type host molecule is higher than the LUMO level Ea of the guest molecule, and the HOMO level Ep of the p-type host molecule is higher than the HOMO level Eb of the guest molecule. On the other hand, also in the case where the HOMO level Ep of the p-type host molecule is lower than the HOMO level Eb of the guest molecule by 0.1 eV or more and the LUMO level En of the n-type host molecule is lower than the LUMO level Ea of the guest molecule by 0.1 eV or more, based on the same principle, a hole and an electron are recombined in the guest molecule efficiently. In that case, first, a hole is injected into the HOMO level of the guest molecule, and then due to the coulomb interaction, an electron is injected into the guest molecule.

In addition, when the LUMO level En of the n-type host molecule is higher than the LUMO level Ea of the guest molecule and the HOMO level Ep of the p-type host molecule is lower than the HOMO level Eb of the guest molecule, a charge is injected into the guest more efficiently so that the guest is excited. In that case, it is preferable that at least LUMO level En of the n-type host molecule is higher than the LUMO level Ea of the guest molecule by 0.1 eV or more or the HOMO level Ep of the p-type host molecule is lower than the HOMO level Eb of the guest molecule by 0.1 eV or more.

In addition, when the n-type host molecule that is an anion and the p-type host molecule that is a cation are adjacent to each other, the both make an exciplex in some cases. At that time, in order to put the guest molecule near the exciplex be in an excited state, the above-described energy transfer process is needed and in that case, the energy difference between the excited state and the ground state of the exciplex and the energy difference between the triplet excited state and the ground state of the guest molecule are preferably close to each other.

If the LUMO level of the n-type host molecule is higher than the LUMO level of the guest molecule by only 0.1 eV, materials that allows HOMO level of the p-type host molecule to be lower than the HOMO level of the guest molecule by only 0.1 eV may be selected, so that the energy difference between the excited state and the ground state of an exciplex and the energy difference between the triplet excited state and the ground state of the guest molecule can be as equal as possible.

Specifically, the LUMO level and the HOMO level of Ir(dppm)$_2$(acac) used as a guest are −2.98 eV and −5.56 eV, respectively; the LUMO level and the HOMO level of 2mDBTPDBq-II used as an n-type host are −2.78 eV and −5.88 eV, respectively; and the LUMO level and the HOMO level of PCBNBB used as a p-type host are −2.31 eV and −5.46 eV, respectively.

In such a combination, the LUMO level of the guest is lower than the LUMO levels of the n-type host and the p-type host, in particular, is lower than the LUMO level of the n-type host by 0.2 eV, and thus, the guest molecule easily becomes an anion by trapping an electron. In addition, although the HOMO level of the guest molecule is higher than the HOMO level of the n-type host molecule, the HOMO level of the guest molecule is lower than the HOMO level of the p-type host molecule by 0.1 eV.

Therefore, as illustrated in FIGS. 3A to 3C, an electron is first injected to the LUMO level of the guest, and due to the coulomb interaction, a hole is injected to the guest so that light is emitted.

In addition, the LUMO level of Ir(mppr-Me)$_2$(dpm) is −2.77 eV and is substantially equal to the LUMO level (−2.78 eV) of the n-type host (2mDBTPDBq-II). In addition, the HOMO level of Ir(mppr-Me)$_2$(dpm) is −5.50 eV, which is lower than the HOMO level (−5.43 eV) of the p-type host (PCBNBB) by 0.07 eV.

These values show that Ir(mppr-Me)$_2$(dpm) is inferior to Ir(dppm)$_2$(acac) in trapping an electron or a hole, when Ir(mppr-Me)$_2$(dpm) is used together with the n-type host or the p-type host described above.

Embodiment 3

Figure 1B:
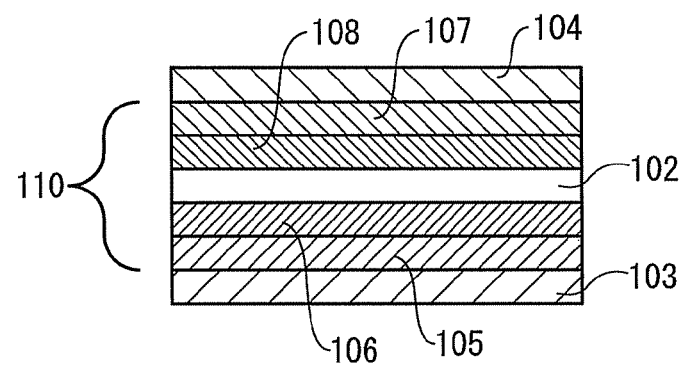

In this embodiment, a light-emitting element of one embodiment of the present invention will be described with reference to FIG. 1B. In the light-emitting element illustrated in FIG. 1B, an EL layer 110 is provided between a first electrode 103 and a second electrode 104. The light-emitting element illustrated in FIG. 1B includes a first carrier-injection layer 105, a first carrier-transport layer 106, a light-emitting layer 102, a second carrier-transport layer 108, and a second carrier-injection layer 107, which are stacked over the first electrode 103 in this order, and the second electrode 104, which is provided thereover. The EL layer 110 includes the first carrier-injection layer 105, the first carrier-transport layer 106, the second carrier-transport layer 108, and the second carrier-injection layer 107, in addition to the light-emitting layer 102. It is to be noted that the EL layer 110 does not necessarily include all of these layers.

The first electrode 103 serves as one of an anode and a cathode, while the second electrode 104 serves as the other of the anode and the cathode. In addition, the first carrier serves as one of a hole and an electron, while the second carrier serves as the other of the hole and the electron. In addition, when the first electrode serves as an anode, the first carrier serves as a hole, and when the first electrode serves as a cathode, the first carrier serves as an electron. In addition, each of the first carrier-injection layer 105 and the second carrier-injection layer 107 serves as a hole-injection layer or an electron-injection layer, and each of the first carrier-transport layer 106 and the second carrier-transport layer 108 serves as a hole-transport layer or an electron-transport layer.

As an anode, metal, an alloy, a conductive compound, and a mixture thereof each having a high work function (specifically, 4.0 eV or more) is preferably used. Specifically, an example thereof is indium oxide-tin oxide (ITO: Indium Tin Oxide), indium tin oxide containing silicon or silicon oxide, indium zinc oxide (IZO), indium oxide containing tungsten oxide and zinc oxide (IWZO), or the like. Such a conductive metal oxide film is usually formed by a sputtering method, but may also be formed by application of a sol-gel method or the like.

For example, a film of indium oxide-zinc oxide can be formed by a sputtering method using a target in which zinc oxide is added to indium oxide at 1 wt % to 20 wt %. An IWZO film can be formed by a sputtering method using a target in which 0.5 wt % to 5 wt % of tungsten oxide and 0.1 wt % to 1 wt % of zinc oxide are added to indium oxide. Other examples are graphene, gold, platinum, nickel, tungsten, chromium, molybdenum, iron, cobalt, copper, palladium, nitrides of metal materials (e.g., titanium nitride), and the like.

Note that, in the case where in the EL layer 110, a layer formed in contact with the anode is formed using a composite material in which an organic compound and an electron acceptor (acceptor), which are described later, are mixed, the anode can be formed using any of various types of metals, alloys, and electrically-conductive compounds, a mixture thereof, and the like regardless of the work function. For example, aluminum (Al), silver (Ag), an alloy containing aluminum (e.g., Al—Si), or the like can be used. The anode can be formed by, for example, a sputtering method, an evaporation method (including a vacuum evaporation method), or the like.

For the cathode, any of metals, alloys, electrically conductive compounds, mixtures thereof, and the like which has a low work function (specifically, a work function of 3.8 eV or less) is preferably used. Specific examples thereof are elements that belong to Groups 1 and 2 in the periodic table, that is, alkali metals such as lithium and cesium, alkaline earth metals such as calcium, and strontium, magnesium, alloys thereof (e.g., Mg—Ag and Al—Li), rare earth metals such as europium and ytterbium, alloys thereof, aluminum, silver, and the like.

Note that, in the case where in the EL layer 110, a layer formed in contact with the cathode is formed using a composite material in which the organic compound and the electron donor (donor), which are described later, are mixed, a variety of conductive materials such as Al, Ag, ITO, and indium oxide-tin oxide containing silicon or silicon oxide can be used regardless of the work function. In the formation of the cathode, a vacuum evaporation method or a sputtering method can be used. Alternatively, in the case of using a silver paste or the like, a coating method, an inkjet method, or the like can be used.

The hole-injection layer is a layer having a high hole-injection property. As the substance having a high hole-injection property, metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. A phthalocyanine-based compound such as phthalocyanine (abbreviation: $H_2Pc$), or copper(II) phthalocyanine (abbreviation: CuPc) can also be used.

Alternatively, the following aromatic amine compounds which are low molecular organic compounds can be used: 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), or the like.

Further alternatively, any of high molecular compounds (e.g., oligomers, dendrimers, or polymers) can be used. For example, the following high molecular compound can be used: poly(N-vinylcarbazole) (abbreviation: PVK); poly(-vinyltriphenylamine) (abbreviation: PVTPA); poly[N-(4-{N'-[4-(4-diphenylamino)phenyl]phenyl-N'-phenylamino}phenyl)methacrylamide] (abbreviation: PTPDMA); and poly[N,N'-bis(4-butylphenyl)-N,N'-bis(phenyl)benzidine] (abbreviation: Poly-TPD). A high molecular compound to which acid is added, such as poly (3,4-ethylenedioxythiophene)/poly(styrenesulfonic acid) (PEDOT/PSS), or polyaniline/poly(styrenesulfonic acid) (PAni/PSS), can also be used.

For the hole-injection layer, the composite material formed by combining an organic compound and an electron acceptor (an acceptor) may be used. Such a composite material is superior in hole-injection and hole-transport properties, because holes are generated in the organic compound by the electron acceptor. In this case, the organic compound is preferably a material excellent in transporting the generated holes (a substance having high hole-transport property).

As the organic compound for the composite material, various compounds such as an aromatic amine compound, carbazole derivatives, aromatic hydrocarbon, and a high molecular compound (such as oligomer, dendrimer, or polymer) can be used. The organic compound used for the composite material is preferably an organic compound with high hole-transport property. Specifically, a substance having a hole mobility of $10^{-6}$ cm$^2$/Vs or higher is preferably used. However, other substances than the above-described materials may also be used as long as the substances have higher hole-transport properties than electron-transport properties. The organic compounds which can be used for the composite material will be specifically listed below.

Examples of the organic compound that can be used for the composite material are aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or a-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP), and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(N-carbazolyl)phenyl]-10-phenylanthracene (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

In addition, it is possible to use the following aromatic hydrocarbon compounds: 2-tert-butyl-9,10-di(2-naphthyl) anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, or the like.

Further alternatively, an aromatic hydrocarbon compound such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), or 9,10-bis[4-(2,2-diphenylvinyl)phenyl] anthracene (abbreviation: DPVPA) can be used.

Further, as the electron acceptor, organic compounds such as 7,7,8,8-tetracyano-2,3,5,6-tetrafluoroquinodimethane (abbreviation: $F_4$-TCNQ) and chloranil; and transition metal oxides can be given. In addition, oxides of metals belonging to Groups 4 to 8 in the periodic table can be also given. Specifically, vanadium oxide, niobium oxide, tantalum oxide, chromium oxide, molybdenum oxide, tungsten oxide, manganese oxide, and rhenium oxide are preferable since their electron-accepting properties are high. Among these, molybdenum oxide is especially preferable because it is stable in the air and its hygroscopicity is low and is easily treated.

Note that the hole-injection layer may be formed using a composite material of the above-described high molecular compound, such as PVK, PVTPA, PTPDMA, or Poly-TPD, and the above-described electron acceptor.

The hole-transport layer is a layer that contains a substance with a high hole-transport property. Examples of substances having high hole-transport properties are aromatic amine compounds such as NPB, TPD, BPAFLP, 4,4'-bis[N-(9,9-dimethylfluoren-2-yl)-N-phenylamino]biphenyl (abbreviation: DFLDPBi), and 4,4'-bis[N-(Spiro-9,9'-bifluoren-2-yl)-N-phenylamino]biphenyl (abbreviation: BSPB). The substances mentioned here are mainly ones that have hole motilities of $10^{-6}$ $cm^2/V \cdot s$ or higher. However, other substances than the above described materials may also be used as long as the substances have higher hole-transport properties than electron-transport properties. The layer containing a substance with a high hole-transport property is not limited to a single layer, and two or more layers containing the aforementioned substances may be stacked.

For the hole-transport layer, a carbazole derivative such as CBP, CzPA, or PCzPA or an anthracene derivative such as t-BuDNA, DNA, or DPAnth may also be used.

Further alternatively, for the hole-transport layer, a high molecular compound such as PVK, PVTPA, PTPDMA, or Poly-TPD can be used.

The light-emitting layer 102 is a layer containing a light-emitting substance. The light-emitting layer 102 in this embodiment includes a phosphorescent compound as a guest and an n-type host and a p-type host as hosts. Two or more kinds of n-type hosts (or p-type hosts) can be used.

As the phosphorescent compound, an organometallic complex is preferable, and in particular, iridium complex is preferable. In consideration of energy transfer due to Förster mechanism described above, the molar absorption coefficient of the absorption band in the longest wavelength region of the phosphorescent compound is preferably $2000M^{-1} \cdot cm^{-1}$ or more, more preferably $5000M^{-1} \cdot cm^{-1}$ or more.

Examples of such a compound having a high molar absorption coefficient like that are $Ir(mppr-Me)_2(dpm)$, $Ir(dppm)_2(acac)$, and the like. In particular, a material having a molar absorption coefficient of $5000M^{-1} \cdot cm^{-1}$ or more, such as $Ir(dppm)_2(acac)$, is used, and a light-emitting element that can achieve an external quantum efficiency of about 30% can be obtained.

As the n-type host, in addition to 2mDBTPDBq-II described above, for example, a compound having an electron-accepting property, such as 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation 7mDBTPDBq-II), and 6-[3-(dibenzothiophen-4-yl)phenyl]dibenzo[f,h]quinoxaline (abbreviation 6mDBTPDBq-II) may be used.

In addition, as the p-type host, in addition to PCBNBB described above, a compound having a hole-accepting property, such as 4,4'-bis[N-(1-naphthyl)-N-phenylamino]biphenyl (abbreviation: NPB or α-NPD) or 4-phenyl-4'-(9-phenyl-9H-carbazol-3-yl)triphenylamine (abbreviation: PCBA1BP) may be used. However, these are not limiting examples, and a combination of an n-type host and a p-type host that satisfies the relation on energy level described in Embodiment 1 or 2 can be used.

The electron-transport layer is a layer that contains a substance with a high electron-transport property. As the substance having a high electron-transport property, the following metal complexes can be given: $Alq_3$; tris(4-methyl-8-quinolinolato)aluminum (abbreviation: $Almq_3$); bis(10-hydroxybenzo[h]-quinolinato)beryllium (abbreviation: $BeBq_2$); BAlq; $Zn(BOX)_2$; and bis[2-(2-hydroxyphenyl)benzothiazolato]zinc (abbreviation: $Zn(BTZ)_2$).

Further, a heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), or 4,4'-bis(5-methylbenzoxazol-2-yl)stilbene (abbreviation: BzOs) can also be used.

Further alternatively, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy) can be used. The substances mentioned here are mainly ones that have an electron mobility of $10^{-6}$ $cm^2/V \cdot s$ or higher. Note that any substance other than the above substances may be used for the electron-transport layer as long as such a substance has an electron-transport property higher than a hole-transport property.

Furthermore, the electron-transport layer is not limited to a single layer, and two or more layers made of the aforementioned substances may be stacked.

The electron-injection layer is a layer including a high electron-injection substance. For the electron-injection layer, an alkali metal, an alkaline earth metal, or a compound thereof, such as lithium, cesium, calcium, lithium fluoride, cesium fluoride, calcium fluoride, or lithium oxide, can be used. In addition, a rare earth metal compound such as erbium fluoride can also be used. Further, any of the above substances which can form the electron-transport layer can be used.

A composite material in which an organic compound and an electron donor (donor) are mixed may also be used for the electron-injection layer. The composite material is superior in electron-injection and electron-transport properties, since electrons are generated in the organic compound by the electron donor. In this case, the organic compound is preferably a material excellent in transporting the generated electrons. Specifically, the foregoing materials for forming the electron-transport layer (e.g., a metal complex or a heteroaromatic compound) can be used for example.

An electron donor may be a substance having an electron-donating property to an organic compound. Specific examples are an alkali metal, an alkaline-earth metal, and a rare earth metal, such as lithium, cesium, magnesium, calcium, erbium, or ytterbium. Alternatively, an alkali metal oxide or an alkaline-earth metal oxide is preferable, and there are, for example, lithium oxide, calcium oxide, barium oxide, and the like. Alternatively, Lewis base such as magnesium oxide can also be used. Further alternatively, an organic compound such as tetrathiafulvalene (abbreviation: TTF) can be used.

Note that the hole-injection layer, the hole-transport layer, the light-emitting layer 102, the electron-transport layer, and the electron-injection layer, which are mentioned above, can each be formed by a method, such as an evaporation method (including a vacuum evaporation method), an inkjet method, or a coating method.

Figure 1C:
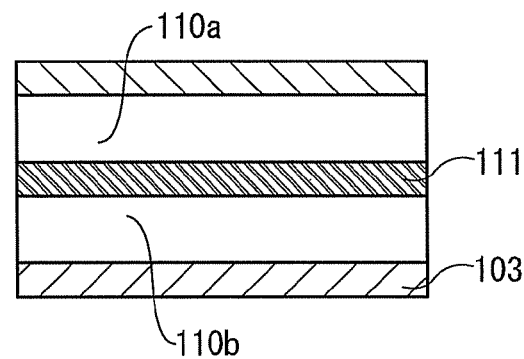

As illustrated in FIG. 1C, between the anode and the cathode, a plurality of EL layers 110a and 110b may be stacked. In this case, EL layers 110a and 110b each include at least a light-emitting layer. In that case, a charge generation layer 111 is preferably provided between the first EL layer 110a and the second EL layer 110b, which are stacked. The charge generation layer 111 can be formed by using the above-mentioned composite material. Further, the charge generation layer 111 may have a stacked structure including a layer containing the composite material and a layer containing another material.

In that case, as the layer containing another material, a layer containing an electron-donating substance and a highly electron-transport substance, a layer formed of a transparent conductive film, or the like can be used. As for a light-emitting element having such a structure, problems such as energy transfer and quenching hardly occur, and a light-emitting element which has both high light emission efficiency and long lifetime can be easily obtained due to expansion in the choice of materials. Moreover, a light-emitting element which provides phosphorescence from one of the EL layers and fluorescence from the other of the EL layers can be readily obtained. Note that this structure can be combined with the above-mentioned structures of the EL layer.

Further, by forming EL layers to emit light of different colors from each other, a light-emitting element as a whole can provide light emission of a desired color. For example, the emission colors of the first EL layer 110a and the second EL layer 110b are complementary, whereby the light-emitting element can be made to emit white light as a whole. This can be applied to a light-emitting element having three or more EL layers.

Figure 1D:
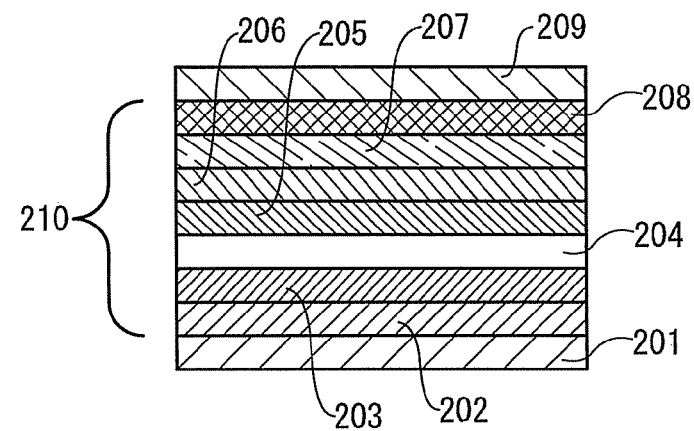

Alternatively, as illustrated in FIG. 1D, between an anode 201 and a cathode 209, an EL layer 210 may be formed, which includes a hole-injection layer 202, a hole-transport layer 203, a light-emitting layer 204, an electron-transport layer 205, an electron-injection buffer layer 206, an electron-relay layer 207, and a composite material layer 208 in contact with the cathode 209.

It is preferable to provide the composite material layer 208 which is in contact with the cathode 209 because damages caused to the EL layer 210 particularly when the cathode 209 is formed by a sputtering method can be reduced. For the composite material layer 208, the above-described composite material in which an acceptor substance is mixed with an organic compound having a high hole-transport property can also be used.

Further, by providing the electron-injection buffer layer 206, an injection barrier between the composite material layer 208 and the electron-transport layer 205 can be reduced; thus, electrons generated in the composite material layer 208 can be easily injected to the electron-transport layer 205.

A substance having a high electron-injection property can be used for the electron-injection buffer layer 206: for example, an alkali metal, an alkaline earth metal, a rare earth metal, or a compound of such metal (e.g., an alkali metal compound (including an oxide such as lithium oxide, a halide, and a carbonate such as lithium carbonate or cesium carbonate), an alkaline earth metal compound (including an oxide, a halide, and a carbonate thereof), or a rare earth metal compound (including an oxide, a halide, and a carbonate thereof)).

Further, in the case where the electron-injection buffer layer 206 contains a substance having a high electron-transport property and a donor substance, the donor substance is preferably added so that the mass ratio of the donor substance to the substance having a high electron-transport property is from 0.001:1 to 0.1:1. Note that as the substance having a high electron-transport property, a material similar to the material for the electron-transport layer 205 described above can be used.

Examples of the donor substance include an organic compound such as tetrathianaphthacene (abbreviation: TTN), nickelocene, and decamethylnickelocene, in addition to an alkali metal, an alkaline earth metal, a rare earth metal, a compound of such metal (e.g., an alkali metal compound (including, an oxide such as lithium oxide, a halide, and a carbonate such as lithium carbonate or cesium carbonate), an alkaline earth metal compound (including an oxide, a halide, and carbonate thereof), and a rare earth metal compound (including an oxide, a halide, and carbonate thereof)).

Furthermore, the electron-relay layer 207 is preferably formed between the electron-injection buffer layer 206 and the composite material layer 208. The electron-relay layer 207 is not necessarily provided; however, by providing the electron-relay layer 207 having a high electron-transport property, electrons can be rapidly transported to the electron-injection buffer layer 206.

The structure in which the electron-relay layer 207 is sandwiched between the composite material layer 208 and the electron-injection buffer layer 206 is a structure in which the acceptor substance contained in the composite material layer 208 and the donor substance contained in the electron-injection buffer layer 206 are less likely to interact with each other, and thus their functions hardly interfere with each other. Accordingly, an increase in the driving voltage can be prevented.

The electron-relay layer 207 contains a substance having a high electron-transport property and is formed such that the LUMO level of the substance having a high electron-transport property is located between the LUMO level of the acceptor substance contained in the composite material layer 208 and the LUMO level of the substance having a high electron-transport property contained in the electron-transport layer 205.

In the case where the electron-relay layer 207 contains a donor substance, the donor level of the donor substance is controlled so as to be located between the LUMO level of the acceptor substance in the composite material layer 208 and the LUMO level of the substance having a high electron-transport property contained in the electron-transport layer 205. As a specific value of the energy level, the LUMO level of the substance having a high electron-transport property contained in the electron-relay layer 207 is preferably −5.0 eV or more, more preferably from −5.0 eV to −3.0 eV.

As the substance having a high electron-transport property contained in the electron-relay layer 207, a phthalocyanine-based material or a metal complex having a metal-oxygen bond and an aromatic ligand is preferably used.

As the phthalocyanine-based material contained in the electron relay layer 207, specifically, any of the following is preferably used: CuPc, a phthalocyanine tin(II) complex (SnPc), a phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc).

As the metal complex having a metal-oxygen bond and an aromatic ligand, which is contained in the electron-relay layer 207, a metal complex having a metal-oxygen double bond is preferably used. The metal-oxygen double bond has an acceptor property (property of easily accepting electrons); thus, electrons can be transferred (donated and accepted) more easily. Further, the metal complex which has a metal-oxygen double bond is considered stable. Thus, the use of the metal complex having the metal-oxygen double bond makes it possible to drive the light-emitting element at low voltage more stably.

As a metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and the acceptor property is high.

Note that as the phthalocyanine-based materials described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent. Thus, a phthalocyanine derivative has an advantage of being easily handled during formation of the light-emitting element and an advantage of facilitating maintenance of an apparatus used for forming a film.

The electron-relay layer 207 may further contain a donor substance. Examples of the donor substance include an organic compound such as tetrathianaphthacene (abbreviation: TTN), nickelocene, and decamethylnickelocene, in addition to an alkali metal, an alkaline earth metal, a rare earth metal, and a compound of such metals (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is contained in the electron-relay layer 207, electrons can be transferred easily and the light-emitting element can be driven at lower voltage.

In the case where a donor substance is contained in the electron-relay layer 207, in addition to the materials described above as the substance having a high electron-transport property, a substance having a LUMO level of higher than the acceptor level of the acceptor substance contained in the composite material layer 208 can be used. As a specific energy level, a LUMO level is −5.0 eV or more, preferably from −5.0 eV to −3.0 eV. As examples of such a substance, a perylene derivative and a nitrogen-containing condensed aromatic compound can be given. Note that a nitrogen-containing condensed aromatic compound is preferably used for the electron-relay layer 207 because of its stability.

As specific examples of the perylene derivative, the following can be given: 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (Hex PTC), and the like.

As specific examples of the nitrogen-containing condensed aromatic compound, the following can be given: pirazino[2,3-f][1,10]phenanthroline-2,3-dicarbonitrile (PPDN), 2,3,6,7,10,11-hexacyano-1,4,5,8,9,12-hexaazatriphenylene (HAT(CN)$_6$), 2,3-diphenylpyrido[2,3-b]pyrazine (2PYPR), 2,3-bis(4-fluorophenyl)pyrido[2,3-b]pyrazine (F2PYPR), and the like.

Besides, 7,7,8,8-tetracyanoquinodimethane (abbreviation: TCNQ), 1,4,5,8-naphthalenetetracarboxylicdianhydride (abbreviation: NTCDA), perfluoropentacene, copper hexadecafluoro phthalocyanine (abbreviation: $F_{16}$CuPc), N,N'-bis(2,2,3,3,4,4,5,5,6,6,7,7,8,8-pentadecafluorooctyl)-1,4,5,8-naphthalenetetracarboxylic diimide (abbreviation: NTCD1-C8F), 3',4'-dibutyl-5,5''-bis(dicyanomethylene)-5,5''-dihydro-2,2':5',2''-terthiophene (abbreviation: DCMT), methanofullerene (e.g., [6,6]-phenyl $C_{61}$ butyric acid methyl ester), or the like can be used.

Note that in the case where a donor substance is contained in the electron-relay layer 207, the electron-relay layer 207 may be formed by a method such as co-evaporation of the substance having a high electron-transport property and the donor substance.

The hole-injection layer 202, the hole-transport layer 203, the light-emitting layer 204, and the electron-transport layer 205 may be each formed using any of the above-described materials. In the above manner, the EL layer 210 of this embodiment can be manufactured.

In the above-described light-emitting element, current flows due to a potential difference generated between the anode and the cathode and holes and electrons are recombined in the EL layer, whereby light is emitted. Then, the emitted light is extracted outside through one or both of the anode and the cathode. Therefore, one or both of the anode and the cathode is/are an electrode(s) that can transmit visible light.

Further, a structure of the layer provided between the anode and the cathode is not limited to the above described structure. A structure other than the above may alternatively be employed as long as a light-emitting region in which holes and electrons are recombined is provided in a portion away from the anode and the cathode in order to prevent quenching due to proximity of the light-emitting region to a metal.

In other words, a stacked structure of the layer is not particularly limited, and a layer formed of a substance having a high electron-transport property, a substance having a high hole-transport property, a substance having a high electron-injection property, a substance having a high hole-injection property, a bipolar substance (a substance having a high electron-transport property and a high hole-transport property), a hole-blocking material, or the like may freely be combined with a light-emitting layer.

Note that by use of a light-emitting element described in this embodiment, a passive matrix light-emitting device or an active matrix light-emitting device in which driving of the light-emitting element is controlled by a transistor can be manufactured. Further, the light-emitting device can be applied to electronic devices, lighting devices, or the like.

Example 1

In Example 1, a light-emitting element according to one embodiment of the present invention will be described. Chemical formulae of materials used in this example are shown below.

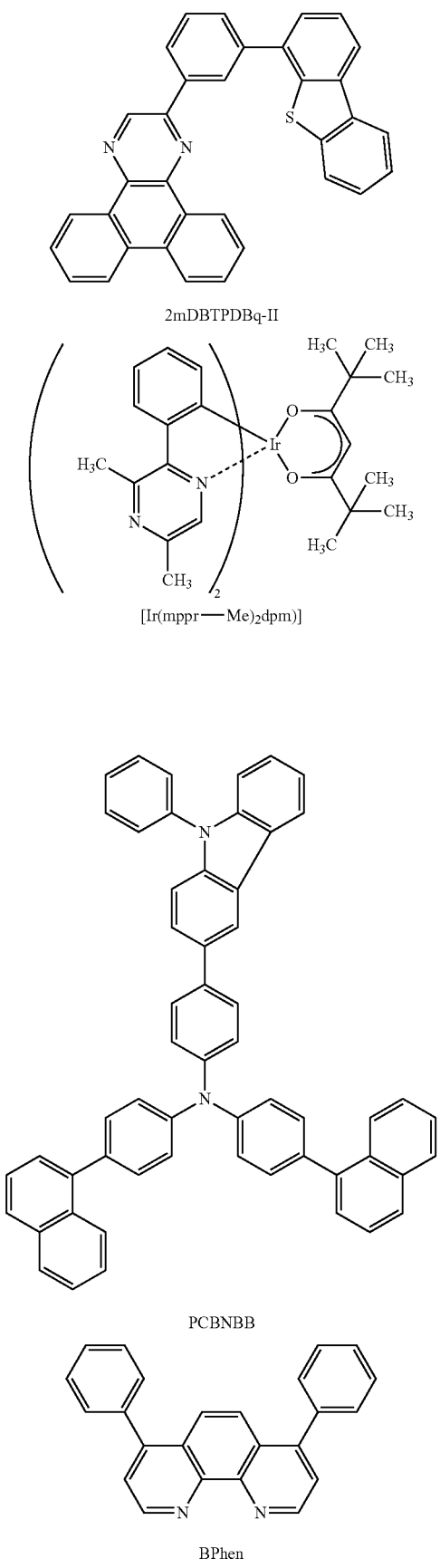

2mDBTPDBq-II

[Ir(mppr—Me)₂dpm)]

PCBNBB

BPhen

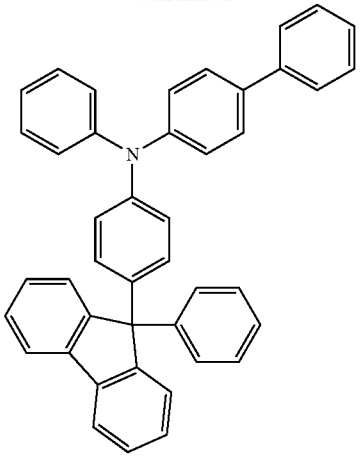

BPAFLP

Hereinafter, methods of fabricating a light-emitting element 1 of this example and a reference light-emitting element 2 will be described.

(Light-Emitting Element 1)

First, a film of indium tin oxide containing silicon oxide (ITSO) was formed over a glass substrate by a sputtering method, so that a first electrode which functions as an anode was formed. The thickness was 110 nm and the electrode area was 2 mm×2 mm.

Next, as pretreatment for forming the light-emitting element over the substrate, a surface of the substrate was washed with water, baked at 200° C. for one hour, and subjected to UV ozone treatment for 370 seconds.

Then, the substrate was transferred into a heating chamber of a vacuum evaporation apparatus whose pressure was reduced to about $10^{-4}$ Pa, vacuum baking at 170° C. for 30 minutes was performed, and then the substrate was cooled down for about 30 minutes.

Next, the substrate was transferred into an evaporation chamber of the vacuum evaporation apparatus. The pressure in the vacuum evaporation apparatus was reduced to about $10^{-4}$ Pa in a state that the substrate is fixed to a substrate holder so that a surface of the substrate on which the first electrode was formed faced downward. Then, by an evaporation method using resistance heating, BPAFLP and molybdenum(VI) oxide were co-evaporated to form a hole-injection layer over the first electrode. The thickness of the hole-injection layer was set to 40 nm, and the weight ratio of BPAFLP to molybdenum oxide was adjusted to 4:2 (=BPAFLP:molybdenum oxide).

Next, a BPAFLP film was formed to a thickness of 20 nm over the hole-injection layer, whereby a hole-transport layer was formed.

Next, 2mDBTPDBq-II, PCBNBB, and [Ir(mppr-Me)₂(dpm)]) were co-evaporated to form a light-emitting layer over the hole-transport layer. The weight ratio of 2mDBTPDBq-II to PCBNBB and [Ir(mppr-Me)₂(dpm)] was adjusted to 0.8:0.2:0.05 (=2mDBTPDBq-II:PCBNBB: [Ir(mppr-Me)₂(dpm)]). The thickness of the light-emitting layer was set to 40 nm.

Next, a 2mDBTPDBq-II film was formed to a thickness of 10 nm on the light-emitting layer, whereby a first electron-transport layer was fainted.

Next, a BPhen film was formed to a thickness of 20 nm on the first electron-transport layer, whereby a second electron-transport layer was formed.

Further, a lithium fluoride (LiF) film was formed to a thickness of 1 nm on the second electron-transport layer by evaporation, whereby an electron-injection layer was formed.

Lastly, an aluminum film was formed to a thickness of 200 nm by evaporation as a second electrode functioning as a cathode. Thus, the light-emitting element 1 of this example was fabricated.

(Reference Light-Emitting Element 2)

The light-emitting layer of the reference light-emitting element 2 was formed by co-evaporation of 2mDBTPDBq-II and Ir(mppr-Me)$_2$(dpm). The weight ratio of 2mDBTPDBq-II to [Ir(mppr-Me)$_2$(dpm)] was adjusted to 1:0.05 (=2mDBTPDBq-II: [Ir(mppr-Me)$_2$(dpm)]). The thickness of the light-emitting layer was set to 40 nm. The layers other than the light-emitting layer were formed in a similar manner to those of the light-emitting element 1.

Note that, in the above evaporation process, evaporation was all performed by a resistance heating method.

Figure 5:
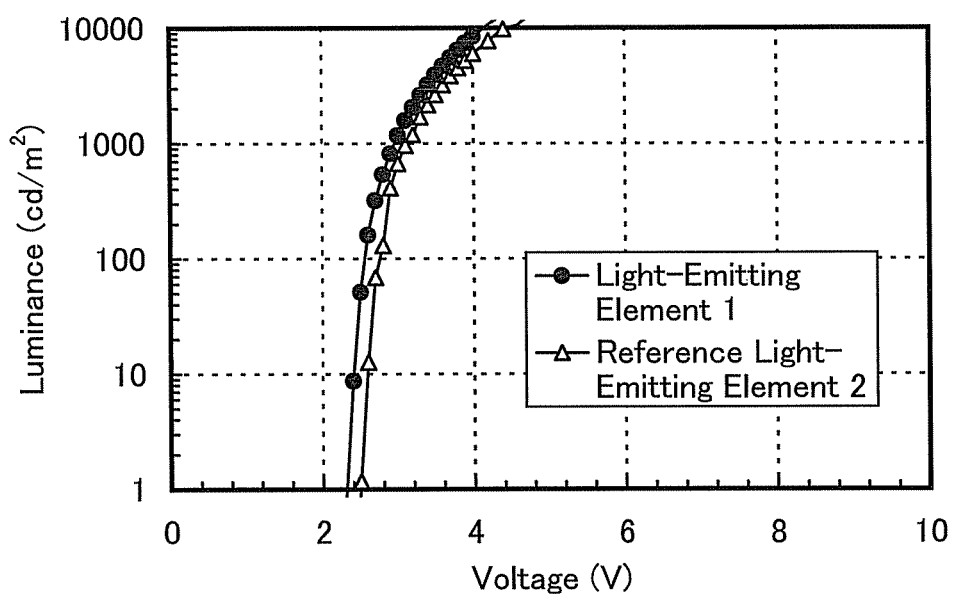
FIG. 5 is a graph showing luminance vs. voltage plots of the light-emitting elements in Example 1.
Figure 6:
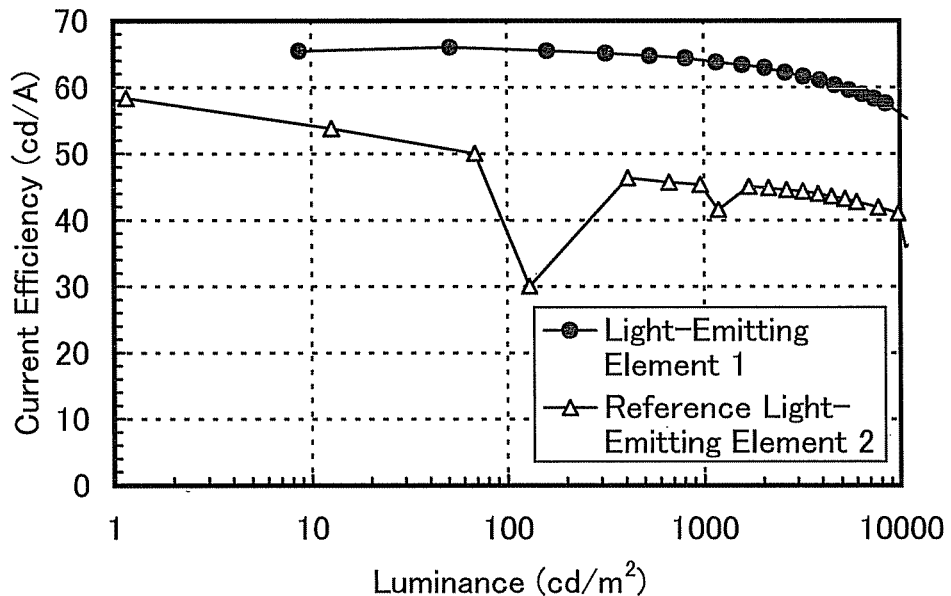
FIG. 6 is a graph showing current efficiency vs. luminance plots of the light-emitting elements in Example 1.
Figure 7:
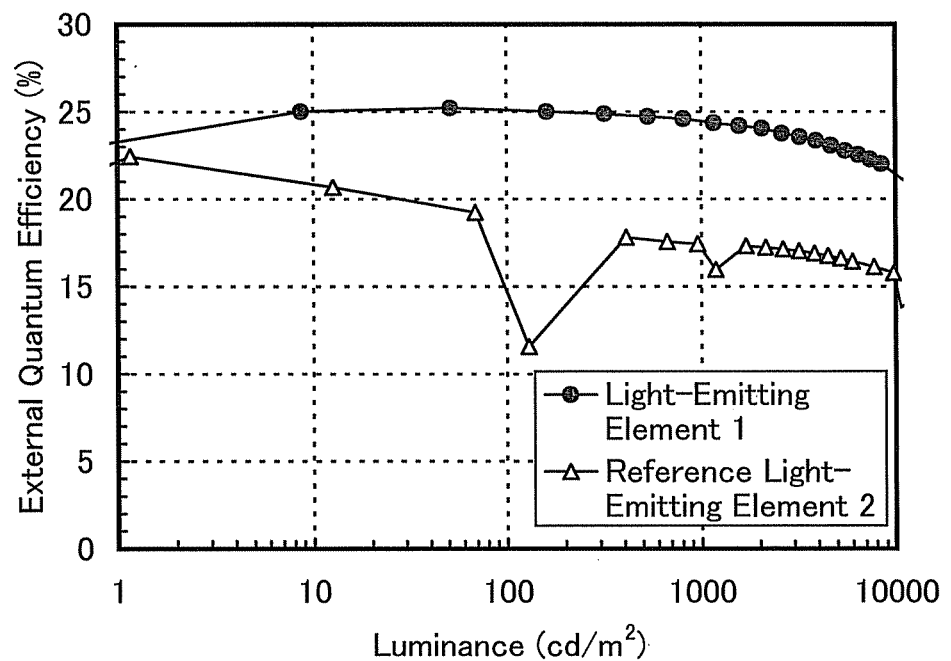
FIG. 7 is a graph showing external quantum efficiency vs. luminance plots of the light-emitting elements in Example 1.

Table 1 shows element structures of, the light-emitting element 1 and the reference light-emitting element 2 obtained as described above. In this example, 2mDBTPDBq-II served as an n-type host, PCBNBB served as a p-type host, and Ir(mppr-Me)$_2$(dpm) served as a guest. In other words, in the light-emitting element 1, the n-type host and the p-type host are present in the light-emitting layer, while in the reference light-emitting element 2, the p-type host is not present in the light-emitting layer.

density (mA/cm$^2$) and the vertical axis represents luminance (cd/m$^2$). FIG. 5 shows luminance vs. voltage plots of the light-emitting element 1 and the reference light-emitting element 2. In FIG. 5, the horizontal axis represents voltage (V) and the vertical axis represents luminance (cd/m$^2$). FIG. 6 shows current efficiency vs. luminance plots of the light-emitting element 1 and the reference light-emitting element 2. In FIG. 6, the horizontal axis represents luminance (cd/m$^2$), and the vertical axis represents current efficiency (cd/A). In addition, FIG. 7 shows external quantum efficiency vs. luminance plots of the light-emitting element 1 and the reference light-emitting element 2. In FIG. 7, the horizontal axis represents luminance (cd/m$^2$) and the vertical axis represents external quantum efficiency (%).

Further, Table 2 shows the voltage (V), current density (mA/cm$^2$), CIE chromaticity coordinates (x, y), luminance (cd/m$^2$), current efficiency (cd/A), power efficiency (lm/W),

TABLE 1

| | first electrode | hole-injection layer | hole-transport layer | light-emitting layer | first electron-transport layer | second electron-transport layer | electron-injection layer | second electrode |
|---|---|---|---|---|---|---|---|---|
| lihgt-emitting element 1 | ITSO 110 nm | BPAFLP:MoOx (=4:2) 40 nm | BPAFLP 20 nm | 2mDBTPDBq-II:PCBNBB:[Ir(mppr-Me)$_2$(dpm)] (=0.8:0.2:0.05) 40 nm | 2mDBTPDBq-II 10 nm | BPhen 20 nm | LiF 1 nm | Al 200 nm |
| reference light-emitting element 2 | ITSO 110 nm | BPAFLP:MoOx (=4:2) 40 nm | BPAFLP 20 nm | 2mDBTPDBq-II:[Ir(mppr-Me)$_2$(dpm)] (=1:0.05) 40 nm | 2mDBTPDBq-II 10 nm | BPhen 20 nm | LiF 1 nm | Al 200 nm |

In a glove box under a nitrogen atmosphere, these light-emitting elements were sealed so as not to be exposed to air. Then, operation characteristics of these light-emitting elements were measured. Note that the measurement was performed at room temperature (in an atmosphere kept at 25° C.).

Figure 4:
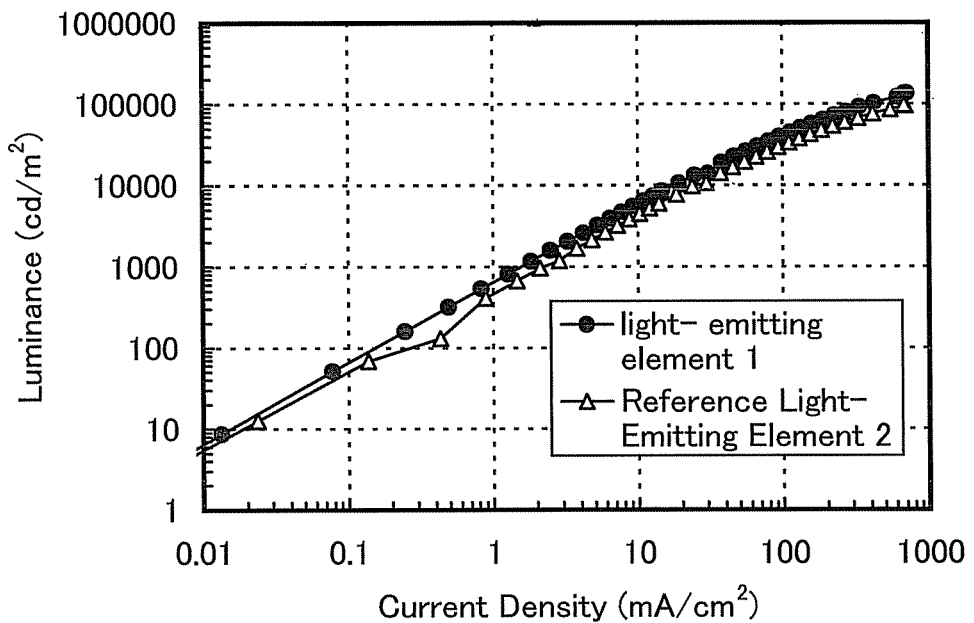
FIG. 4 is a graph showing luminance vs. current density plots of light-emitting elements in Example 1.

FIG. 4 shows luminance vs. current density plots of the light-emitting element 1 and the reference light-emitting element 2. In FIG. 4, the horizontal axis represents current and external quantum efficiency (%) of each of the light-emitting element 1 and the reference light-emitting element 2 at a luminance of around 1000 cd/m$^2$.

TABLE 2

| | Voltage (V) | current density (mA/cm$^2$) | chromaticity coordinates (x, y) | luminance (cd/m$^2$) | current efficiency (cd/A) | power efficiency (lm/W) | external quantum efficiency (%) |
|---|---|---|---|---|---|---|---|
| light-emitting element 1 | 3.0 | 1.8 | (0.56, 0.44) | 1200 | 64 | 67 | 24 |
| reference light-emitting element 2 | 3.1 | 2.1 | (0.55, 0.44) | 960 | 45 | 46 | 17 |

Figure 8:
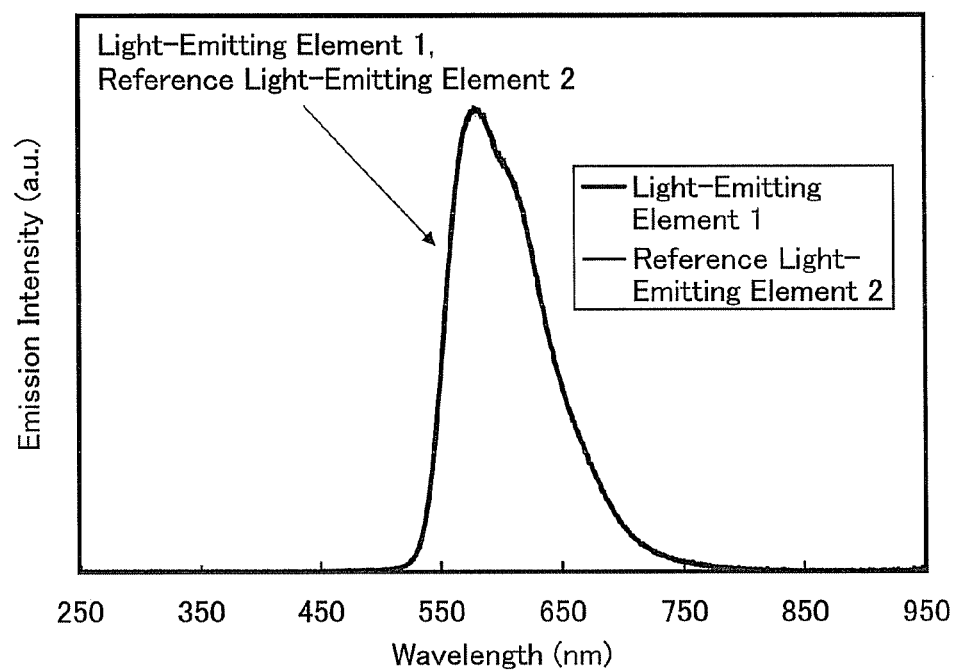
FIG. 8 is a graph showing emission spectra of the light-emitting elements in Example 1.

FIG. 8 shows emission spectra of the light-emitting element 1 and the reference light-emitting element 2 which were obtained when a current of 0.1 mA was applied to the light-emitting elements. In FIG. 8, the horizontal axis represents wavelength (nm) and the vertical axis represents emission intensity (arbitrary unit). In addition, as shown in Table 2, the CIE chromaticity coordinates of the light-emitting element 1 at a luminance of 1200 cd/m² were (x, y)=(0.56, 0.44) and the CIE chromaticity coordinates of the reference light-emitting element 2 at a luminance of 960 cd/m² were (x, y)=(0.55, 0.44). The results show that orange light emission originating from [Ir(mppr-Me)$_2$(dpm)] was obtained from the light-emitting element 1 and the reference light-emitting element 2.

As apparent from Table 2 and FIG. 4 to FIG. 7, the light-emitting element 1 has higher current efficiency, higher power efficiency, and higher external quantum efficiency than those of the reference light-emitting element 2. In general, when light generated in a light emitter is tried to be extracted outside, light is extracted only at 25 to 30% of internal quantum efficiency, due to total reflection between the atmosphere and the substrate and others.

In consideration of that, the internal quantum efficiency of the reference light-emitting element 2 is estimated to be at most 60%, but the internal quantum efficiency of the light-emitting element 1 is estimated to about 80%. The above results indicate that application of one embodiment of the present invention makes it possible to realize a light-emitting element with high external quantum efficiency.

Figure 9:
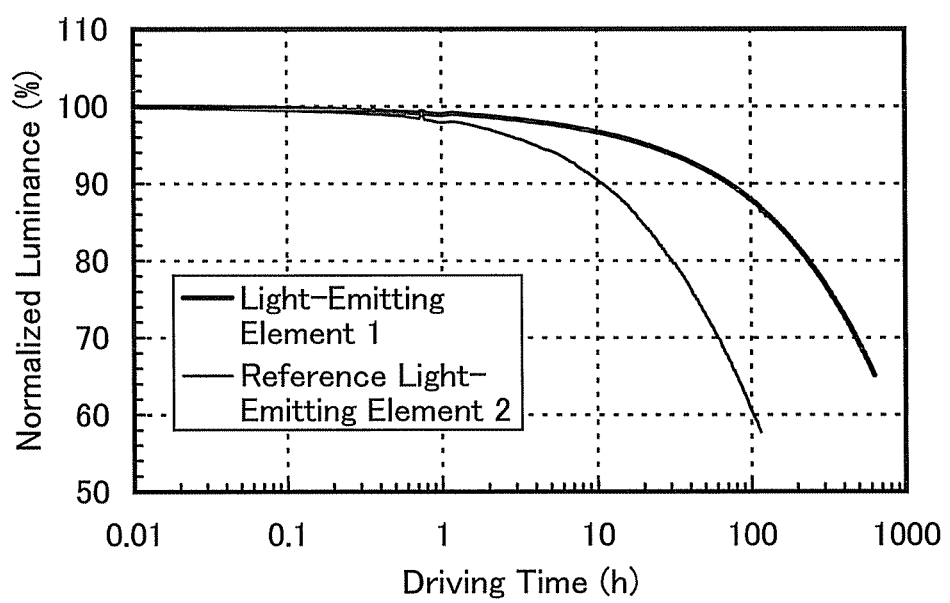
FIG. 9 is a graph showing reliability test results of the light-emitting elements in Example 1.

Next, a reliability test of the light-emitting element 1 and the reference light-emitting element 2 was conducted. Results of the reliability test are shown in FIG. 9. In FIG. 9, the vertical axis represents normalized luminance (%) with respect to an initial luminance of 100%, and the horizontal axis represents driving time (h) of the element. In the reliability test, the light-emitting element 1 was driven under the conditions where the initial luminance was set to 5000 cd/m² and the current density was constant.

The luminance of the reference light-emitting element 2 after 120 hours was 58% of the initial luminance. The luminance of the light-emitting element 1 after 630 hours was 65% of the initial luminance. This shows that the light-emitting element 1 has a longer lifetime than that of the reference light-emitting element 2. These results suggest that an element having high reliability can be realized by application of one embodiment of the present invention.

Example 2

In Example 2, a light-emitting element according to one embodiment of the present invention will be described. Chemical formulae of materials used in this example are shown below. Note that chemical formulae of the materials used in the above examples are omitted here.

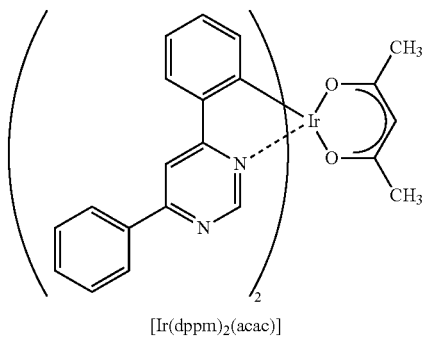

[Ir(dppm)$_2$(acac)]

A method for fabricating a light-emitting element 3 will be described below.

(Light-Emitting Element 3)

First, an ITSO film was formed over a glass substrate by a sputtering method, so that a first electrode functioning as an anode was formed. The thickness was 110 nm and the electrode area was 2 mm×2 mm.

Next, as pretreatment for forming the light-emitting element over the substrate, a surface of the substrate was washed with water, baked at 200° C. for one hour, and subjected to UV ozone treatment for 370 seconds.

Then, the substrate was transferred into a heating chamber of a vacuum evaporation apparatus whose pressure was reduced to about $10^{-4}$ Pa, vacuum baking at 170° C. for 30 minutes was performed, and then the substrate was cooled down for about 30 minutes.

Next, the substrate was transferred into an evaporation chamber of the vacuum evaporation apparatus. The pressure in the vacuum evaporation apparatus was reduced to about $10^{-4}$ Pa in a state that the substrate is fixed to a substrate holder so that a surface of the substrate on which the first electrode was formed faced downward. Then, by an evaporation method using resistance heating, BPAFLP and molybdenum(VI) oxide were co-evaporated to form a hole-injection layer over the first electrode. The thickness of the hole-injection layer was set to 40 nm, and the weight ratio of BPAFLP to molybdenum oxide was adjusted to 4:2 (=BPAFLP:molybdenum oxide).

Next, a BPAFLP film was formed to a thickness of 20 nm over the hole-injection layer, whereby a hole-transport layer was formed.

Further, 2mDBTPDBq-II, PCBNBB, and [Ir(dppm)$_2$(acac)] were co-evaporated to form a light-emitting layer on the hole-transport layer. The weight ratio of 2mDBTPDBq-II to PCBNBB and [Ir(dppm)$_2$(acac)] was adjusted to 0.8:0.2:0.05 (=2mDBTPDBq-II:PCBNBB: [Ir(dppm)$_2$(acac)]). The thickness of the light-emitting layer was set to 40 nm.

Next, a 2mDBTPDBq-II film was formed to a thickness of 10 nm on the light-emitting layer, whereby a first electron-transport layer was formed.

Next, a BPhen film was formed to a thickness of 20 nm on the first electron-transport layer, whereby a second electron-transport layer was formed.

Further, a 1-nm-thick film of LiF was formed over the second electron-transport layer by evaporation, whereby an electron-injection layer was formed.

Lastly, an aluminum film was formed to a thickness of 200 nm by evaporation as a second electrode functioning as a cathode. Thus, the light-emitting element 3 of this example was fabricated.

Note that, in the above evaporation process, evaporation was all performed by a resistance heating method.

Table 3 shows an element structure of the light-emitting element 3 obtained as described above.

TABLE 3

| | first electrode | hole-injection layer | hole-transport layer | light-emitting layer | first electron-transport layer | second electron-transport layer | electron-injection layer | second electrode |
|---|---|---|---|---|---|---|---|---|
| light-emitting element 3 | ITSO 110 nm | BPAFLP:MoOx (=4:2) 40 nm | BPAFLP 20 nm | 2mDBTPDBq-II:PCBNBB:[Ir(dppm)$_2$(acac)] (=0.8:0.2:0.05) 40 nm | 2mDBTPDBq-II 10 nm | BPhen 20 nm | LiF 1 nm | Al 200 nm |

In a glove box under a nitrogen atmosphere, the light-emitting element 3 was sealed so as not to be exposed to air. Then, operation characteristics of the element were measured. Note that the measurement was performed at room temperature (in an atmosphere kept at 25° C.).

Figure 10:
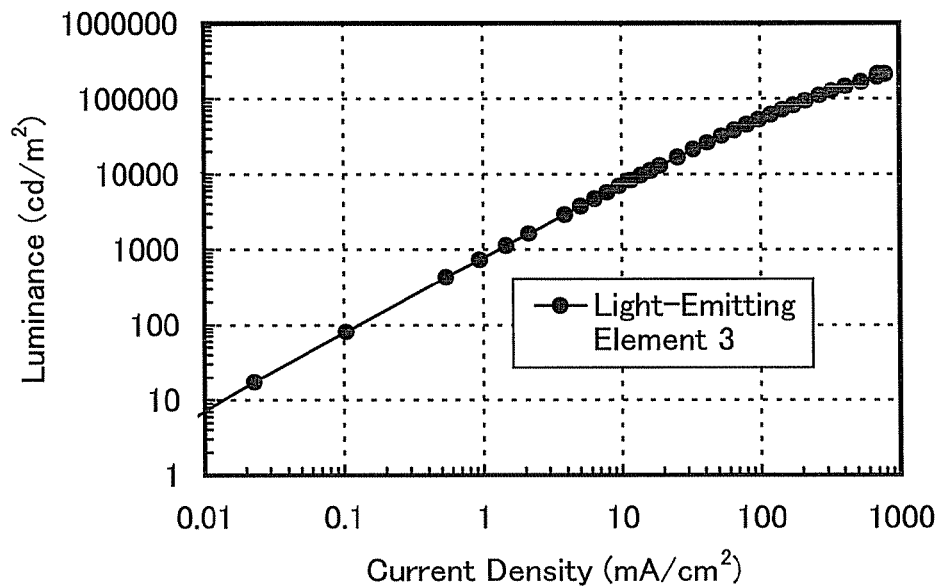
FIG. 10 is a graph showing a luminance vs. current density plot of a light-emitting element in Example 2.
Figure 11:
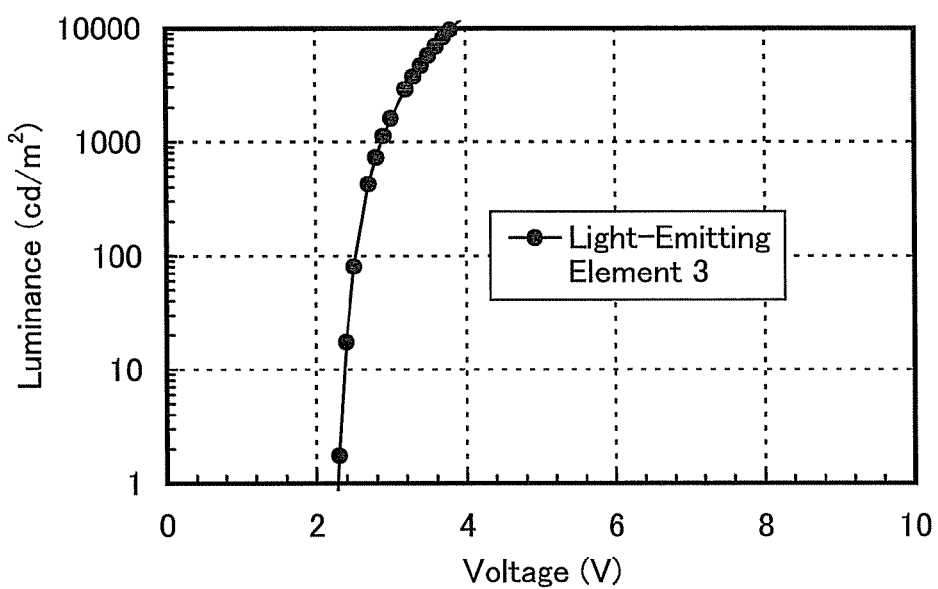
FIG. 11 is a graph showing a luminance vs. voltage plot of the light-emitting element in Example 2.
Figure 12:
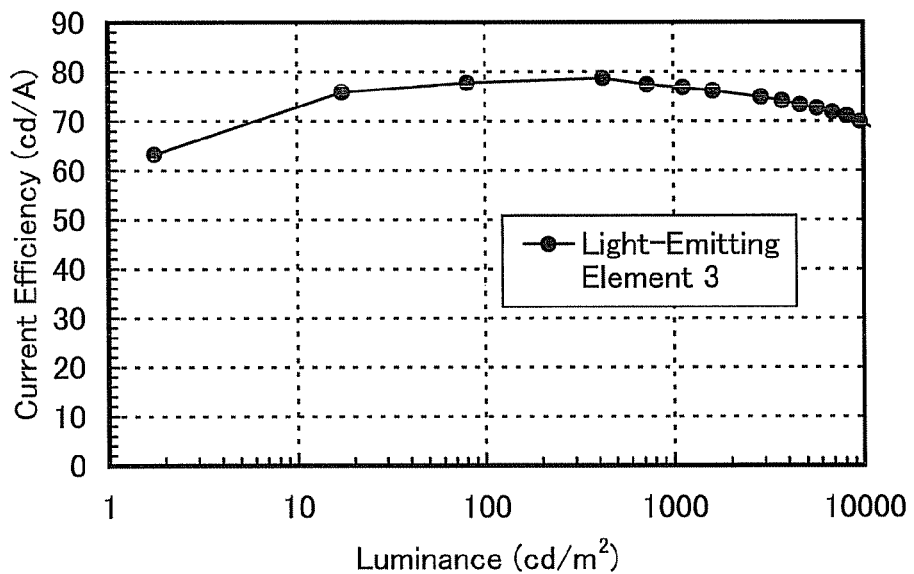
FIG. 12 is a graph showing a current efficiency vs. luminance plot of the light-emitting element in Example 2.
Figure 13:
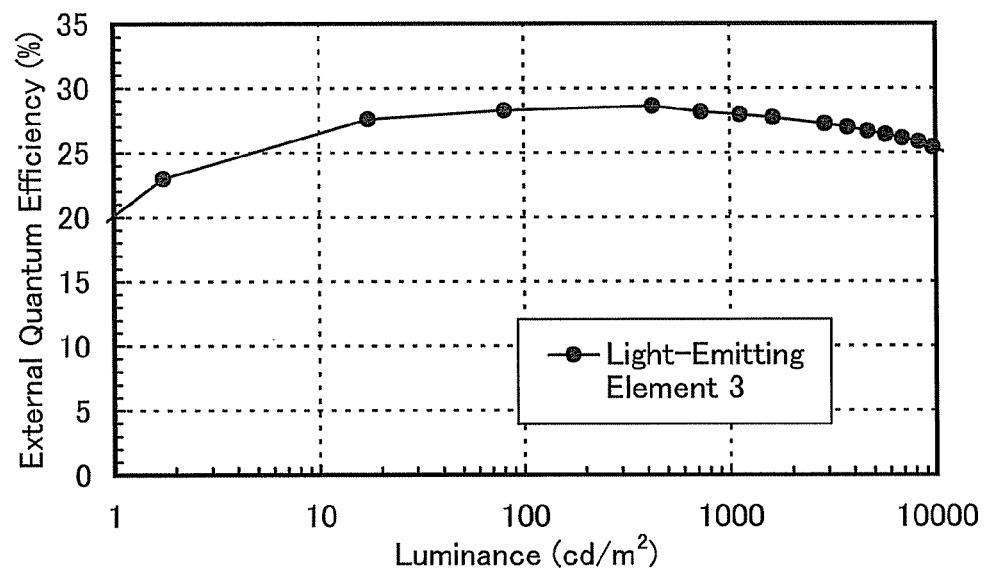
FIG. 13 is a graph showing an external quantum efficiency vs. luminance plot of the light-emitting element in Example 2.

FIG. 10 shows a luminance vs. current density plot of the light-emitting element 3. In FIG. 10, the horizontal axis represents current density (mA/cm$^2$) and the vertical axis represents luminance (cd/m$^2$). FIG. 11 shows a luminance vs. voltage plot of the light-emitting element 3. In FIG. 11, the horizontal axis represents voltage (V), and the vertical axis represents luminance (cd/m$^2$). FIG. 12 shows a current efficiency vs. luminance plot of the light-emitting element 3. In FIG. 12, the horizontal axis represents luminance (cd/m$^2$), and the vertical axis represents current efficiency (cd/A). Also, FIG. 13 shows an external quantum efficiency vs. luminance plot of the light-emitting element 3. In FIG. 13, the horizontal axis represents luminance (cd/m$^2$) and the vertical axis represents external quantum efficiency (%).

Further, Table 4 shows voltage (V), current density (mA/cm$^2$), CIE chromaticity coordinates (x, y), current efficiency (cd/A), power efficiency (lm/W), and external quantum efficiency (%) of the light-emitting element 3 at a luminance of 1100 cd/m$^2$.

TABLE 4

| | Voltage (V) | current density (mA/cm$^2$) | chromaticity coordinates (x, y) | current efficiency (cd/A) | power efficiency (lm/W) | external quantum efficiency (%) |
|---|---|---|---|---|---|---|
| light-emitting element 3 | 2.9 | 1.5 | (0.54, 0.46) | 77 | 83 | 28 |

Figure 14:
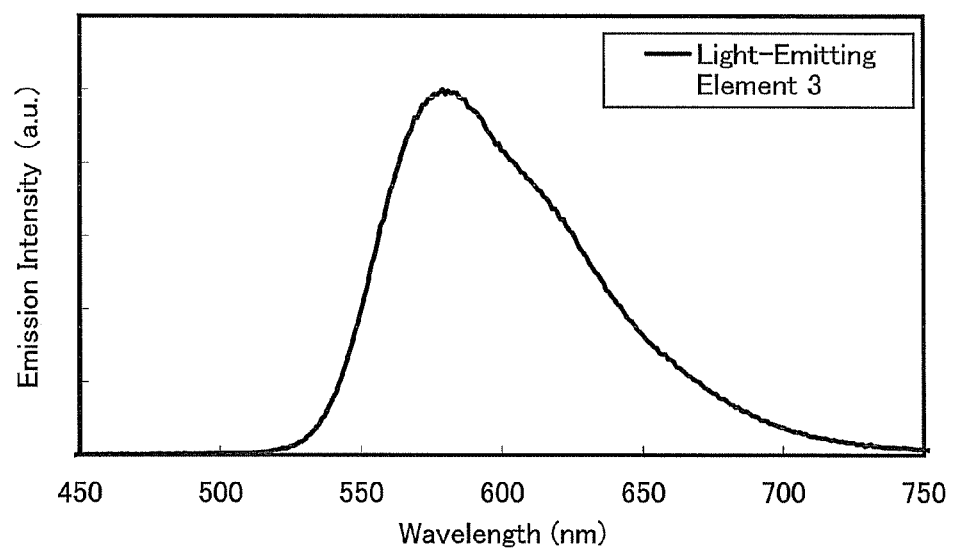
FIG. 14 is a graph showing an emission spectrum of the light-emitting element in Example 2.

FIG. 14 shows an emission spectrum of the light-emitting element 3 which was obtained when a current of 0.1 mA was applied to the light-emitting element. In FIG. 14, the horizontal axis represents wavelength (nm) and the vertical axis represents emission intensity (arbitrary unit). In addition, as shown in Table 4, the CIE chromaticity coordinates of the light-emitting element 3 were (x, y)=(0.54, 0.46) at a luminance of 1100 cd/m$^2$. The result shows that orange light emission originating from [Ir(dppm)$_2$(acac)] was obtained from the light-emitting element 3.

As apparent from Table 4 and FIG. 10 to FIG. 13, the light-emitting element 3 has high current efficiency, high power efficiency, and high external quantum efficiency. In particular, the light-emitting element 3 has an extremely high external quantum efficiency at a luminance of 1100 cd/m$^2$, which is 28%. This is converted to the internal quantum efficiency, which is 90% or higher. The above results indicate that application of one embodiment of the present invention makes it possible to realize a light-emitting element with high external quantum efficiency.

Figure 15:
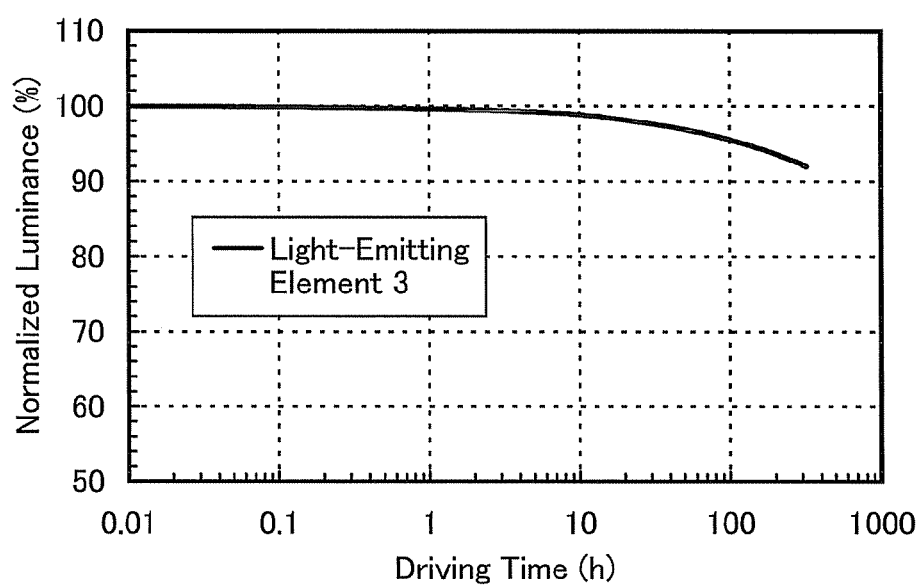
FIG. 15 is a graph showing reliability test results of the light-emitting element in Example 2.

Next, the light-emitting element 3 was subjected to a reliability test. Results of the reliability test are shown in FIG. 15. In FIG. 15, the vertical axis represents normalized luminance (%) with respect to an initial luminance of 100%, and the horizontal axis represents driving time (h) of the element.

In the reliability test, the light-emitting element 3 was driven under the conditions where the initial luminance was set to 5000 cd/m$^2$ and the current density was constant. The light-emitting element 3 kept 92% of the initial luminance after the driving for 320 hours. The above result suggests that an element having high reliability can be realized by application of one embodiment of the present invention.

Example 3

Although a T1 level of an organic material can be determined by optical measurement of a thin film or a solution of the material, it is obtained also by molecular orbital calculations. Molecular orbital calculations can be used in order to estimate a T1 level of an unknown material, for example. In this example, T1 levels of Ir(dppm)$_2$acac, Ir(mppr-Me)$_2$dpm (both used as guests), 2mDBTPDBqII (used as an n-type host) and PCBNBB (used as a p-type host) are calculated.

The calculating method is as follows. Initially, the most stable structures both in the singlet ground state (S$_o$) and in the triplet excited state (T$_1$) for each molecule were calculated by using a density functional theory (DFT). Then, a vibration analysis was conducted on the most stable structures both in S$_o$ and T$_1$, and zero-point corrected energies were obtained. A T1 level of each molecule was calculated from the difference in the zero-point corrected energies between S$_o$ and T$_1$.

In the calculation for the n-type host molecule and the p-type host molecule, as a basis function, 6-311G (basis function of a triple-split valence basis set using three contraction functions for each valence orbital) was adopted for all atoms. The above basis function involves, for example, 1s to 3s orbitals in the case of hydrogen atoms, and 1s to 4s orbitals and 2p to 4p orbitals in the case of carbon atoms. Further, to improve calculation accuracy, the p function and the d function as polarization basis sets were added respectively to hydrogen atoms and atoms other than hydrogen atoms. B3LYP as a functional was used to specify the weight of each parameter related to exchange-correlation energy.

In the calculation for the guest molecules, LanL2DZ was adopted as a basis function for Ir atoms while 6-311G as a basis function was adopted for all atoms other than Ir atoms. Further, to improve calculation accuracy, the p function and the d function as polarization basis sets were added respectively to hydrogen atoms and atoms other than hydrogen atoms. B3PW91 as a functional was used to specify the weight of each parameter related to exchange-correlation energy.

Note that Gaussian09 was used as a quantum chemistry computational program. A high performance computer (Altix 4700, manufactured by SGI Japan, Ltd.) was used for the calculations.

T1 levels of $Ir(dppm)_2acac$, $Ir(mppr-Me)_2dpm$, 2mDBT-PDBqII and PCBNBB, which are obtained in the calculation, are 2.13 eV, 2.13 eV, 2.42 eV and 2.31 eV, respectively. These values are close to those obtained by optical measurements.

From the above results, it was confirmed that the T1 levels of 2mDBTPDBqII which can be used as an n-type host and PCBNBB which can be used as a p-type host are higher than the T1 levels of $Ir(dppm)_2acac$ or $Ir(mppr-Me)_2dpm$ which can be used as guests, by 0.15 eV or more. Accordingly, it is suggested that the transition from a triplet excited state of a guest molecule to a triplet excited state of an n-type host molecule or a p-type host molecule can be sufficiently reduced, and that a light-emitting element having high external quantum efficiency can be obtained.

As described above, the T1 levels obtained by optical measurements are very close to the T1 levels obtained by molecular orbital calculations. Therefore, it is possible to estimate a T1 level of a novel organic compound by the molecular orbital calculation and to evaluate whether the organic compound is useful for heightening emission efficiency or not, without synthesis of the organic compound. This application is based on Japanese Patent Applications serial no. 2011-042120 filed with Japan Patent Office on Feb. 28, 2011, and serial no. 2011-042122 filed with Japan Patent Office on Feb. 28, 2011, the entire contents of which are hereby incorporated by reference.

What is claimed is:

1. A light-emitting element comprising:
    a pair of electrodes; and
    a light-emitting layer between the pair of electrodes, the light-emitting layer comprising:
        a phosphorescent compound;
        a first organic compound having an electron-transport property superior to a hole-transport property; and
        a second organic compound having a hole-transport property superior to an electron-transport property,
    wherein an energy difference between a triplet excited state and a ground state of the first organic compound and an energy difference between a triplet excited state and a ground state of the second organic compound are both higher than an energy difference between a triplet excited state and a ground state of the phosphorescent compound by 0.15 eV or more,
    wherein a combination of the first organic compound and the second organic compound is capable of forming an exciplex therebetween,
    wherein an excited energy of the exciplex is transferred to the phosphorescent compound so as to emit phosphorescence from the phosphorescent compound, and
    wherein the phosphorescent compound, the first organic compound, and the second organic compound are mixed in the light-emitting layer.

2. The light-emitting element according to claim 1, wherein the exciplex is formed from an anion of the first organic compound and a cation of the second organic compound.

3. The light-emitting element according to claim 1, wherein at least one of the first organic compound and the second organic compound is a fluorescent compound.

4. The light-emitting element according to claim 1, wherein the phosphorescent compound is an organometallic complex.

5. A light-emitting element comprising:
    a pair of electrodes; and
    a light-emitting layer between the pair of electrodes, the light-emitting layer comprising:
        a phosphorescent compound;
        a first organic compound having an electron-transport property superior to a hole-transport property; and
        a second organic compound having a hole-transport property superior to an electron-transport property,
    wherein a lowest unoccupied molecular orbital level of the first organic compound is higher than a lowest unoccupied molecular orbital level of the phosphorescent compound by 0.1 eV or more,
    wherein a combination of the first organic compound and the second organic compound is capable of forming an exciplex therebetween,
    wherein an excited energy of the exciplex is transferred to the phosphorescent compound so as to emit light from the phosphorescent compound, and
    wherein the phosphorescent compound, the first organic compound, and the second organic compound are mixed in the light-emitting layer.

6. The light-emitting element according to claim 5, wherein the exciplex is formed from an anion of the first organic compound and a cation of the second organic compound.

7. The light-emitting element according to claim 5, wherein at least one of the first organic compound and the second organic compound is a fluorescent compound.

8. The light-emitting element according to claim 5, wherein the phosphorescent compound is an organometallic complex.

9. A light-emitting element comprising:
    a pair of electrodes; and
    a light-emitting layer between the pair of electrodes, the light-emitting layer comprising:
        a phosphorescent compound;
        a first organic compound having an electron-transport property superior to a hole-transport property; and
        a second organic compound having a hole-transport property superior to an electron-transport property,
    wherein a highest occupied molecular orbital level of the second organic compound is lower than a highest occupied molecular orbital level of the phosphorescent compound by 0.1 eV or more,
    wherein a combination of the first organic compound and the second organic compound is capable of forming an exciplex therebetween,
    wherein an excited energy of the exciplex is transferred to the phosphorescent compound so as to emit light from the phosphorescent compound, and
    wherein the phosphorescent compound, the first organic compound, and the second organic compound are mixed in the light-emitting layer.

10. The light-emitting element according to claim 9, wherein the exciplex is formed from an anion of the first organic compound and a cation of the second organic compound.

11. The light-emitting element according to claim 9, wherein at least one of the first organic compound and the second organic compound is a fluorescent compound.

12. The light-emitting element according to claim 9, wherein the phosphorescent compound is an organometallic complex.

13. The light-emitting element according to claim 1,
wherein a highest occupied molecular orbital level of the first compound is lower than a highest occupied molecular orbital level of the second compound,
wherein the highest occupied molecular orbital level of the second compound is lower than a lowest unoccupied molecular orbital level of the first compound, and
wherein the lowest unoccupied molecular orbital level of the first compound is lower than a lowest unoccupied molecular orbital level of the second compound.

14. The light-emitting element according to claim 5,
wherein a highest occupied molecular orbital level of the first compound is lower than a highest occupied molecular orbital level of the second compound,
wherein the highest occupied molecular orbital level of the second compound is lower than the lowest unoccupied molecular orbital level of the first compound, and
wherein the lowest unoccupied molecular orbital level of the first compound is lower than a lowest unoccupied molecular orbital level of the second compound.

15. The light-emitting element according to claim 9,
wherein a highest occupied molecular orbital level of the first compound is lower than the highest occupied molecular orbital level of the second compound,
wherein the highest occupied molecular orbital level of the second compound is lower than a lowest unoccupied molecular orbital level of the first compound, and
wherein the lowest unoccupied molecular orbital level of the first compound is lower than a lowest unoccupied molecular orbital level of the second compound.

16. The light-emitting element according to claim 1, wherein a molar absorption coefficient of an absorption band in a longest wavelength region of the phosphorescent compound is preferably $2000 M^{-1} \cdot cm^{-1}$ or more.

17. The light-emitting element according to claim 5, wherein a molar absorption coefficient of an absorption band in a longest wavelength region of the phosphorescent compound is preferably $2000 M^{-1} \cdot cm^{-1}$ or more.

18. The light-emitting element according to claim 9, wherein a molar absorption coefficient of an absorption band in a longest wavelength region of the phosphorescent compound is preferably $2000 M^{-1} \cdot cm^{-1}$ or more.

19. A light-emitting element comprising:
a pair of electrodes; and
a light-emitting layer between the pair of electrodes, the light-emitting layer comprising:
a phosphorescent compound;
a first organic compound; and
a second organic compound,
wherein an energy difference between a triplet excited state and a ground state of the first organic compound is higher than an energy difference between a triplet excited state and a ground state of the phosphorescent compound by 0.15 eV or more,
wherein an energy difference between a triplet excited state and a ground state of the second organic compound is higher than an energy difference between the triplet excited state and the ground state of the phosphorescent compound by 0.15 eV or more,
wherein a combination of the first organic compound and the second organic compound is capable of forming an exciplex,
wherein an excited energy of the exciplex is transferred to the phosphorescent compound so as to emit phosphorescence from the phosphorescent compound,
wherein the phosphorescent compound, the first organic compound, and the second organic compound are mixed in the light-emitting layer, and
wherein the phosphorescent compound is an organometallic complex.

20. The light-emitting element according to claim 19, wherein the exciplex is formed from an anion of the first organic compound and a cation of the second organic compound.

21. The light-emitting element according to claim 19, wherein at least one of the first organic compound and the second organic compound is a fluorescent compound.

22. The light-emitting element according to claim 19, wherein the first compound has an electron-transport property.

23. The light-emitting element according to claim 19, wherein the second organic compound has a hole-transport property.

24. The light-emitting element according to claim 19,
wherein a highest occupied molecular orbital level of the first compound is lower than a highest occupied molecular orbital level of the second compound,
wherein the highest occupied molecular orbital level of the second compound is lower than a lowest unoccupied molecular orbital level of the first compound, and
wherein the lowest unoccupied molecular orbital level of the first compound is lower than a lowest unoccupied molecular orbital level of the second compound.

25. The light-emitting element according to claim 19, wherein a molar absorption coefficient of an absorption band in a longest wavelength region of the phosphorescent compound is preferably $2000 M^{-1} \cdot cm^{-1}$ or more.

* * * * *